(12) United States Patent
Haba et al.

(10) Patent No.: US 7,939,934 B2
(45) Date of Patent: May 10, 2011

(54) MICROELECTRONIC PACKAGES AND METHODS THEREFOR

(75) Inventors: Belgacem Haba, Saratoga, CA (US); David Gibson, Lake Oswego, OR (US)

(73) Assignee: Tessera, Inc., San Jose, CA (US)

( * ) Notice: Subject to any disclaimer, the term of this patent is extended or adjusted under 35 U.S.C. 154(b) by 310 days.

(21) Appl. No.: 11/315,466

(22) Filed: Dec. 22, 2005

(65) Prior Publication Data
US 2006/0249857 A1    Nov. 9, 2006

Related U.S. Application Data

(60) Provisional application No. 60/662,199, filed on Mar. 16, 2005.

(51) Int. Cl.
*H01L 23/48* (2006.01)
*H01L 23/14* (2006.01)

(52) U.S. Cl. ........ 257/697; 257/737; 257/702; 257/778; 257/E23.065

(58) Field of Classification Search .................. 257/737, 257/702, 697, 778
See application file for complete search history.

(56) References Cited

U.S. PATENT DOCUMENTS

| | | | |
|---|---|---|---|
| 4,672,152 A * | 6/1987 | Shinohara et al. ............ | 174/258 |
| 4,695,870 A | 9/1987 | Patraw | |
| 4,716,049 A | 12/1987 | Patraw | |
| 4,804,132 A | 2/1989 | DiFrancesco | |
| 4,902,600 A | 2/1990 | Tamagawa et al. | |
| 4,916,523 A * | 4/1990 | Sokolovsky et al. ......... | 257/668 |
| 4,924,353 A | 5/1990 | Patraw | |
| 4,975,079 A | 12/1990 | Beaman et al. | |
| 4,982,265 A | 1/1991 | Watanabe et al. | |
| 5,070,297 A | 12/1991 | Kwon et al. | |
| 5,083,697 A | 1/1992 | Difrancesco | |
| 5,138,438 A | 8/1992 | Masayuki et al. | |
| 5,148,265 A | 9/1992 | Khandros et al. | |
| 5,148,266 A | 9/1992 | Khandros et al. | |
| 5,189,505 A | 2/1993 | Bartelink | |
| 5,196,726 A | 3/1993 | Nishiguchi et al. | |

(Continued)

FOREIGN PATENT DOCUMENTS

JP       62-68015 A      9/1994

(Continued)

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

(Continued)

*Primary Examiner* — Nitin Parekh
(74) *Attorney, Agent, or Firm* — Lerner, David, Littenberg, Krumholz & Mentlik, LLP

(57) ABSTRACT

An assembly for testing microelectronic devices includes a microelectronic element having faces and contacts, a flexible substrate spaced from and overlying a first face of the microelectronic element, and a plurality of conductive posts extending from the flexible substrate and projecting away from the first face of the microelectronic element, at least some of the conductive posts being electrically interconnected with the microelectronic element. The assembly also includes a plurality of support elements disposed between the microelectronic element and the substrate for supporting the flexible substrate over the microelectronic element. At least some of the conductive posts are offset from the support elements.

45 Claims, 25 Drawing Sheets

U.S. PATENT DOCUMENTS

| | | | | |
|---|---|---|---|---|
| 5,214,308 | A | 5/1993 | Nishiguchi et al. | |
| 5,311,402 | A * | 5/1994 | Kobayashi et al. | 361/760 |
| 5,397,997 | A | 3/1995 | Tuckerman et al. | |
| 5,414,298 | A | 5/1995 | Grube et al. | |
| 5,455,390 | A | 10/1995 | DiStefano et al. | |
| 5,477,611 | A | 12/1995 | Sweis et al. | |
| 5,518,964 | A | 5/1996 | DiStefano et al. | |
| 5,525,545 | A | 6/1996 | Grube et al. | |
| 5,536,362 | A | 7/1996 | Love et al. | |
| 5,615,824 | A | 4/1997 | Fjelstad et al. | |
| 5,627,405 | A * | 5/1997 | Chillara | 257/668 |
| 5,659,952 | A | 8/1997 | Kovac et al. | |
| 5,679,977 | A | 10/1997 | Khandros et al. | |
| 5,731,709 | A | 3/1998 | Pastore et al. | |
| 5,790,377 | A | 8/1998 | Schreiber et al. | |
| 5,802,699 | A | 9/1998 | Fjelstad et al. | |
| 5,854,507 | A | 12/1998 | Miremadi et al. | |
| 5,892,271 | A * | 4/1999 | Takeda et al. | 257/668 |
| 5,973,391 | A | 10/1999 | Bischoff et al. | |
| 5,973,930 | A * | 10/1999 | Ikeda et al. | 361/768 |
| 5,980,270 | A | 11/1999 | Fjelstad et al. | |
| 5,990,546 | A * | 11/1999 | Igarashi et al. | 257/700 |
| 6,052,287 | A | 4/2000 | Palmer et al. | |
| 6,054,756 | A | 4/2000 | DiStefano et al. | |
| 6,086,386 | A | 7/2000 | Fjelstad et al. | |
| 6,177,636 | B1 | 1/2001 | Fjelstad | |
| 6,184,576 | B1 | 2/2001 | Jones et al. | |
| 6,197,613 | B1 | 3/2001 | Kung et al. | |
| 6,202,297 | B1 | 3/2001 | Faraci et al. | |
| 6,211,572 | B1 | 4/2001 | Fjelstad et al. | |
| 6,258,625 | B1 | 7/2001 | Brofman et al. | |
| 6,362,525 | B1 | 3/2002 | Rahim | |
| 6,458,411 | B1 | 10/2002 | Goossen et al. | |
| 6,495,914 | B1 | 12/2002 | Sekine et al. | |
| 6,514,847 | B1 | 2/2003 | Ohsawa et al. | |
| 6,515,355 | B1 | 2/2003 | Yin et al. | |
| 6,522,018 | B1 | 2/2003 | Tay et al. | |
| 6,550,666 | B2 | 4/2003 | Chew et al. | |
| 6,555,908 | B1 | 4/2003 | Eichelberger et al. | |
| 6,555,918 | B2 | 4/2003 | Masuda et al. | |
| 6,560,117 | B2 | 5/2003 | Moon | |
| 6,578,754 | B1 | 6/2003 | Tung | |
| 6,600,233 | B2 * | 7/2003 | Yeoh et al. | 257/779 |
| 6,624,653 | B1 | 9/2003 | Cram | |
| 6,642,136 | B1 | 11/2003 | Lee et al. | |
| 6,674,159 | B1 | 1/2004 | Peterson et al. | |
| 6,703,851 | B1 | 3/2004 | Howell | |
| 6,900,532 | B1 * | 5/2005 | Kelkar et al. | 257/698 |
| 6,902,869 | B2 | 6/2005 | Appelt et al. | |
| 7,176,043 | B2 * | 2/2007 | Haba et al. | 438/14 |
| 2002/0125571 | A1 | 9/2002 | Corisis et al. | |
| 2002/0153602 | A1 | 10/2002 | Tay et al. | |
| 2002/0185717 | A1 | 12/2002 | Eghan et al. | |
| 2003/0164540 | A1 | 9/2003 | Lee et al. | |
| 2003/0164551 | A1 * | 9/2003 | Lee et al. | 257/778 |
| 2004/0169263 | A1 | 9/2004 | Fjelstad | |
| 2004/0262777 | A1 | 12/2004 | Kim et al. | |

FOREIGN PATENT DOCUMENTS

| | | |
|---|---|---|
| WO | WO-97/44859 | 11/1997 |
| WO | WO-2004/025309 | 3/2004 |
| WO | WO-2004/049424 | 6/2004 |
| WO | WO-2005/065207 | 7/2005 |
| WO | WO-2005/085207 | 7/2005 |
| WO | WO-2006/004671 | 1/2006 |

OTHER PUBLICATIONS

North Corporation, "Processed Intra-layer Interconnection Material for PWBs [Etched Copper Bump with Copper Foil]," NMBI™, Version 2001.6.

Partial International Search Report, PCT/US06/009197, Dated Aug. 21, 2006.

* cited by examiner

1400

1600

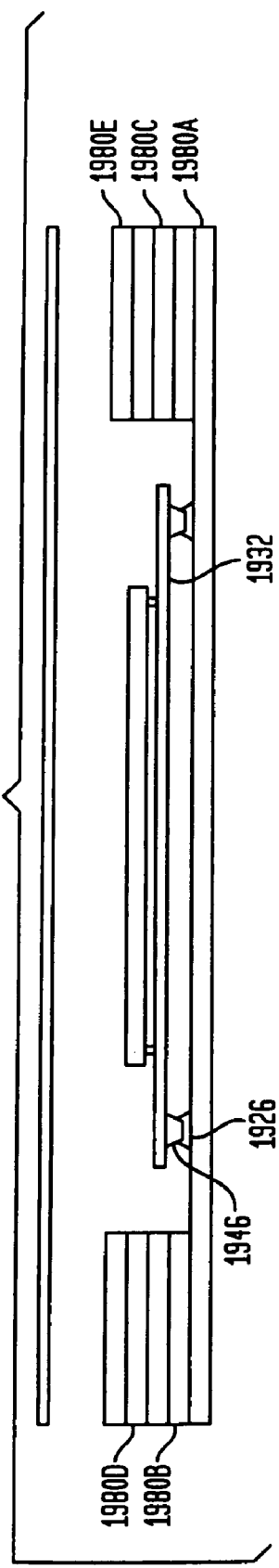
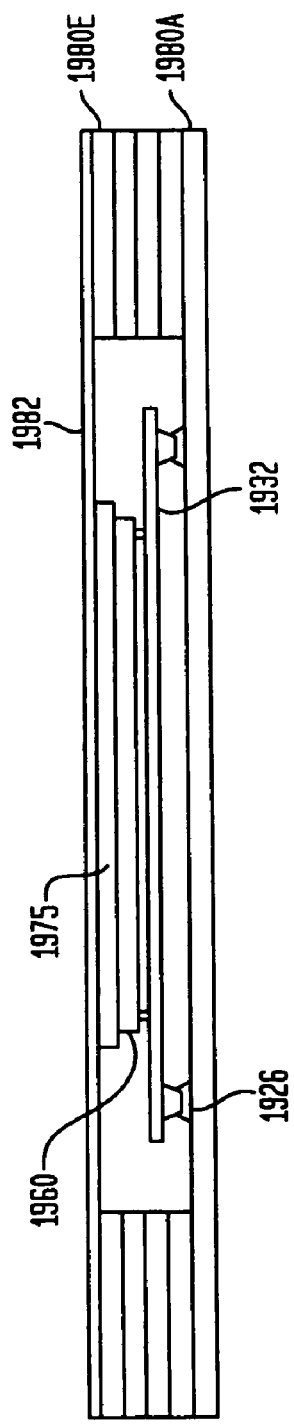

MICROELECTRONIC PACKAGES AND METHODS THEREFOR

CROSS-REFERENCE TO RELATED APPLICATIONS

The present application claims benefit of U.S. Provisional Application No. 60/662,199, filed Mar. 16, 2005, the disclosure of which is hereby incorporated by reference herein.

FIELD OF THE INVENTION

The present invention relates to microelectronic packages and to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder used to connect the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals, which can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing microelectronic packages would be desirable.

SUMMARY OF THE INVENTION

In certain preferred embodiments of the present invention, an assembly for testing microelectronic devices includes a microelectronic element having faces and contacts, a flexible substrate, such as a dielectric sheet, spaced from and overlying a first face of the microelectronic element, and a plurality of conductive posts extending from the flexible substrate and projecting away from the first face of the microelectronic element. At least some of the conductive posts are desirably electrically interconnected with the microelectronic element. The conductive posts may have a base facing toward the flexible substrate.

The assembly also desirably includes a plurality of support elements disposed between the microelectronic element and the substrate. The support elements desirably support the flexible substrate over the microelectronic element, with at least some of the conductive posts being offset from the support elements. A compliant material may be disposed between the flexible substrate and the microelectronic element.

In certain preferred embodiments, at least one of the conductive support elements includes a mass of a fusible material. In other preferred embodiments, at least one of the conductive support elements includes a dielectric core and an electrically conductive outer coating over the dielectric core. The support element may also be elongated, having a length that is greater than its width or diameter.

The microelectronic element may be a printed circuit board or a test board used to test devices such as microelectronic elements and microelectronic packages. The first face of the microelectronic element may be a front face of the microelectronic element and the contacts may be accessible at the front face. In certain preferred embodiments, at least some of the support elements are electrically conductive. The conductive support elements desirably electrically interconnect at least some of the contacts of the microelectronic element with at least some of the conductive posts. In certain preferred embodiments, the support elements include a plurality of second conductive posts extending from the flexible substrate. The second conductive posts preferably project toward the first face of the microelectronic element, with at least some of the second conductive posts being electrically interconnected with the first conductive posts. In certain preferred embodiments, a first conductive post is electrically interconnected to a contact through a second conductive post disposed immediately adjacent to the first conductive post.

The assembly may also include a support frame engaging the flexible substrate. In certain preferred embodiments the flexible substrate has an outer periphery and the support frame is attached to the outer periphery of the flexible substrate. The support frame may be a ring that is attached to the outer periphery of the flexible substrate. The support frame may be made of sturdy materials such as metal, ceramic and hardened plastic.

The testing assembly may also include conductive traces provided on the flexible substrate, whereby the conductive traces electrically interconnect at least some of the conductive posts with at least some of the contacts on the microelectronic element. In certain preferred embodiments, the flexible substrate has a bottom surface facing the first face of the microelectronic element and the conductive traces extend along the bottom surface of the flexible substrate. In other preferred embodiments, the flexible substrate has a top surface facing away from the first face of the microelectronic element and the conductive traces extend along the top surface of the flexible substrate.

The contacts may be spaced from one another in a grid array over the first face of the microelectronic element. In other preferred embodiments, at least some of the contacts are aligned in a row. The contacts may be uniformly spaced from one another over the first face of the microelectronic element. In further preferred embodiments, some of the contacts are uniformly spaced from one another and other contacts are non-uniformly spaced from one another.

The conductive posts may be elongated, whereby the posts have a length that is substantially greater than the width or diameter of the posts. The support elements may be disposed in an array so that the support elements define a plurality of zones on the flexible substrate, each zone being bounded by a plurality of the support elements defining corners of the zone, with different ones of the conductive posts being disposed in different ones of the zones. In preferred embodiments, only one of the conductive posts is disposed in each of the zones.

In another preferred embodiments of the present invention, a microelectronic assembly includes a microelectronic element having faces and contacts, a flexible substrate spaced from and overlying a first face of the microelectronic element, and a plurality of first conductive posts extending from the flexible substrate and projecting away from the first face of the microelectronic element, at least some of the conductive posts being electrically interconnected with the microelectronic element. The assembly also desirably includes a plurality of second conductive posts extending from the flexible substrate and projecting toward the first face of the microelectronic element, the second conductive posts supporting the flexible substrate over the microelectronic element, at least some of the first conductive posts being offset from the second conductive posts.

In preferred embodiments, at least some of the second conductive posts are electrically conductive, the second conductive posts electrically interconnecting at least some of the contacts of the microelectronic element with at least some of the first conductive posts. At least some of the first conductive posts may be connected to at least some of the contacts by second conductive posts located immediately adjacent to the first conductive posts. The assembly may also include conductive traces provided on the flexible substrate, whereby the conductive traces electrically interconnect at least some of the first conductive posts with at least some of the contacts on the microelectronic element. In certain preferred embodiments, at least one of the conductive traces extends between adjacent conductive posts.

In certain preferred embodiments, the assembly may also include a low temperature cofired ceramic (LTCC) structure having a plurality of ceramic layers that are attached together including a bottom layer with contacts, whereby the first conductive posts are electrically interconnected with the contacts of the bottom layer of the LTCC structure. The assembly may also include a sealing cap in contact with a top layer of the LTCC structure and in thermal communication with a second face of the microelectronic element.

In another preferred embodiment of the present invention, a microelectronic assembly includes a microelectronic element having faces and contacts, and a flexible substrate spaced from and overlying a first face of the microelectronic element, the flexible substrate having conductive traces provided thereon. The assembly also desirably includes a plurality of conductive elements extending between the contacts of the microelectronic element and the conductive traces for spacing the flexible substrate from the microelectronic element and for electrically interconnecting the microelectronic element and the conductive traces. The conductive elements may be elongated, conductive posts. The conductive traces preferably have inner ends connected with the conductive elements and outer ends that extend beyond an outer perimeter of the microelectronic element. The outer ends of the conductive traces are desirably movable relative to the contacts of the microelectronic element. The assembly may also include an encapsulant material disposed between the microelectronic element and the flexible substrate.

In another preferred embodiment of the present invention, a microelectronic assembly desirably includes a circuitized substrate having metalized vias extending from a first surface of the substrate toward a second surface of the substrate. The assembly may also include a microelectronic package having conductive posts projecting therefrom, the conductive posts being at least partially inserted into openings of the metalized vias for electrically interconnecting the microelectronic package and the substrate. The microelectronic package may include a microelectronic element having faces and contacts, a flexible substrate spaced from and overlying a first face of the microelectronic element, and a plurality of support elements extending between the microelectronic element and the flexible substrate for spacing the flexible substrate from the microelectronic element. The conductive posts are preferably electrically interconnected with the contacts of the microelectronic element and are provided on a region of the flexible substrate that is located outside a perimeter of the microelectronic element. The conductive posts are desirably movable relative to the contacts of the microelectronic element.

In another preferred embodiment of the present invention, a method of making a post array substrate includes providing a flexible substrate having traces thereon, the substrate having top and bottom surfaces. The method also preferably includes providing first conductive posts on the flexible substrate, the first conductive posts projecting from the top surface of the substrate, with at least some of the first conductive posts being electrically interconnected with the traces. The method may also include providing second conductive posts on the flexible substrate, the second conductive posts projecting from the bottom surface of the substrate, with the first and second conductive posts extending away from one another.

The method may also include electrically interconnecting at least some of the second conductive posts with at least some of the first conductive posts. The substrate may be assembled with a microelectronic element, such as a chip or printed circuit board, so that the top surface of the substrate faces away from the microelectronic element. The assembling step preferably comprises using the second conductive posts for supporting the substrate above the microelectronic element so that the substrate is at least partially free to flex. The method may also include providing a filler material, such as a compliant, dielectric encapsulant, between the substrate and the microelectronic element.

Desirably, at least some of the first conductive posts are offset, in horizontal directions parallel to the plane of the flexible substrate, from the second conductive posts. For example, the second conductive posts may be disposed in an array with zones of the flexible substrate disposed between adjacent support elements, and the first conductive posts may be disposed near the centers of the zones. The offset between the first conductive posts and the second conductive posts allows the first conductive posts, and particularly the bases of the first conductive posts adjacent the substrate, to move relative to the microelectronic element. Most preferably, the arrangement allows each first conductive post to move independently of the other first conductive posts. The movement of the first conductive posts allows the tips of the first conductive posts to simultaneously engage contact pads on an opposing microelectronic element, such as a chip or chip package, despite irregularities in the chip or the package, such as warpage of the chip or package.

Assemblies in accordance with preferred embodiments of the present invention facilitate testing of microelectronic elements and packages having non-planar contacts and interfaces, and avoids the need for specialized, expensive test equipment. In preferred methods according to this aspect of the present invention, movement of the bases of the conductive posts contribute to movement of the tips of the posts, allowing the tips to engage opposing contact pads even where the contact pads themselves are not coplanar with one another.

As noted above, conductive traces may be provided on a flexible substrate for electrically interconnecting at least some of the first conductive posts with at least some of the second conductive posts. These traces may be very short; the length of each trace desirably is equal to the offset distance between a first conductive post and a second conductive post. In preferred forms, this arrangement can prove low-impedance conductive paths between the posts and the microelectronic element, suitable for high-frequency signal transmission.

These and other preferred embodiments of the present invention will be described in more detail below.

BRIEF DESCRIPTION OF THE DRAWINGS

FIGS. 28A-28D show a method of making a microelectronic assembly, in accordance with still further preferred embodiment of the present invention.

DETAILED DESCRIPTION

Figure 1A:
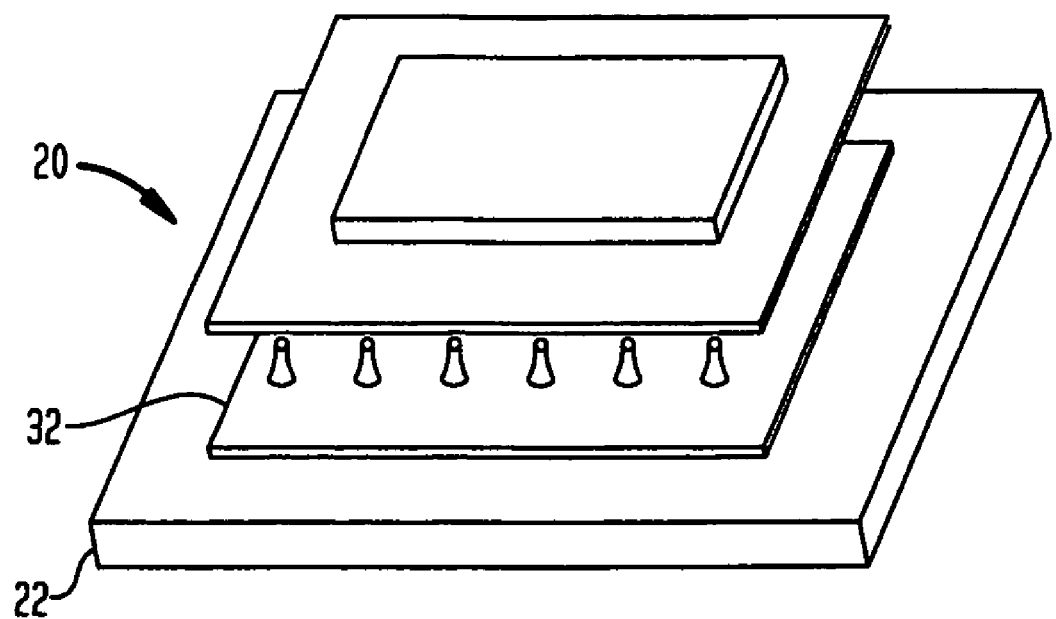
FIG. 1A shows a perspective view of an assembly, in accordance with certain preferred embodiments of the present invention.
Figure 1B:
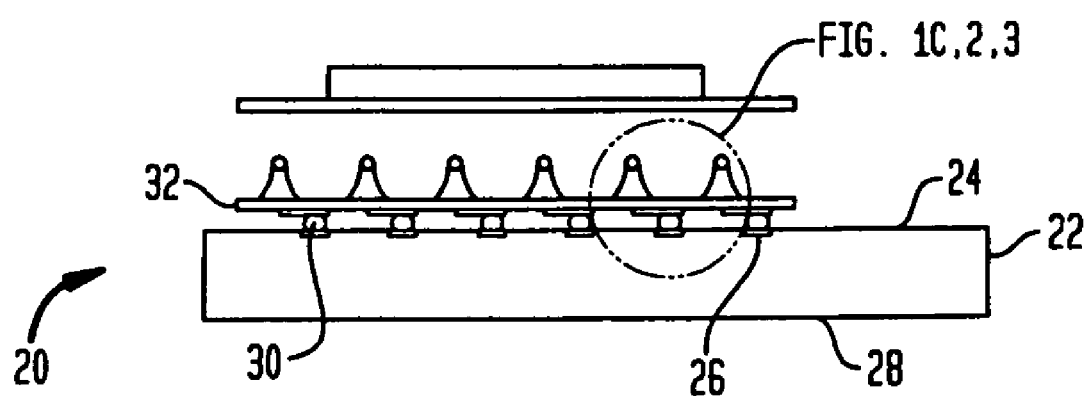
FIG. 1B shows a sectional view of the assembly of FIG. 1A.
Figure 1C:
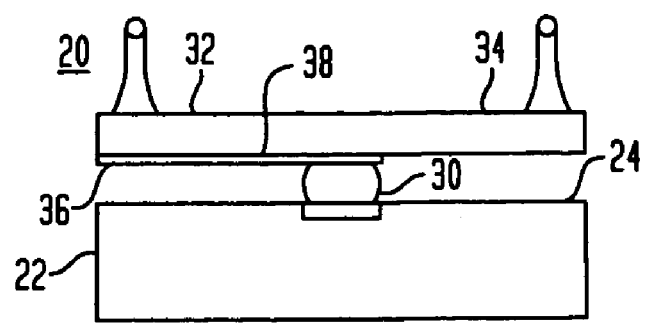
FIG. 1C shows a detailed view of a section of the assembly shown in FIG. 1B.

Referring to FIGS. 1A-1C, in accordance with certain preferred embodiments of the present invention, a testing assembly 20 for microelectronic elements includes a test board 22, such as a printed circuit board or circuitized substrate, having has a first surface 24 with conductive pads 26 and a second surface 28 remote from the first surface 24. A passivation layer (not shown) may be formed over the contact bearing face 24 with openings at the conductive pads 24.

Figure 4A:
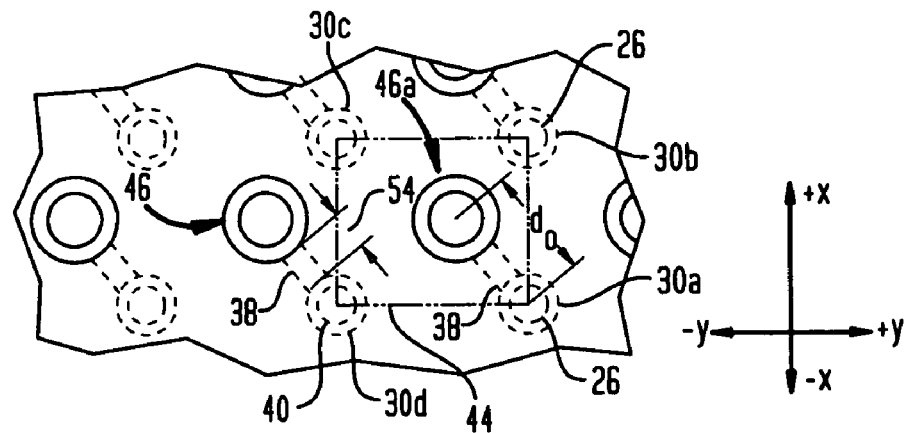
FIG. 4A shows a fragmentary plan view of the assembly shown in FIG. 1A.
Figure 4B:
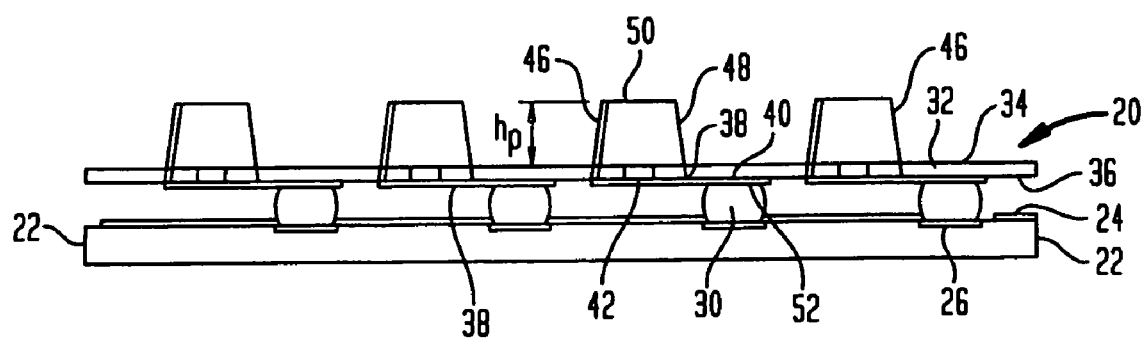
FIG. 4B shows another cross-sectional view of the assembly shown in FIG. 1A.

Referring to FIGS. 1C and 4B, the testing assembly 20 includes conductive support elements 30 such as solder balls in substantial alignment and electrically interconnected with conductive pads 26. The testing assembly 20 also has a flexible dielectric substrate 32, such as a polyimide or other polymeric sheet, including a top surface 34 and a bottom surface 36 remote therefrom. Although the thickness of the dielectric substrate 32 will vary with the application, the dielectric substrate most typically is about 10 µm-100 µm thick. The flexible, dielectric substrate 32 has conductive traces 38 thereon. In the particular embodiment illustrated in FIGS. 1C and 4B, the conductive traces 38 are disposed on the bottom surface 36 of the flexible, dielectric substrate 32. However, in other embodiments, the conductive traces 38 may extend on the top surface 34 of the flexible, dielectric substrate 32, on both the top and bottom faces or within the interior of flexible, dielectric substrate 32. Thus, as used in this disclosure, a statement that a first feature is disposed "on" a second feature should not be understood as requiring that the first feature lie on a surface of the second feature. Conductive traces 38 may be formed from any electrically conductive material, but most typically are formed from copper, copper alloys, gold or combinations of these materials. The thickness of the traces will also vary with the application, but typically is about 5 µm-25 µm. Traces 38 are arranged so that each trace has a support end 40 and a post end 42 remote from the support end.

As best shown in FIG. 4A, contacts 26 and support elements 30 are disposed in an array which columns which in this case is a rectilinear grid, having equally spaced columns extending in a first horizontal direction x and equally spaced rows extending in a second horizontal direction y orthogonal to the first horizontal direction. Each contact 26 and support element 30 is disposed at an intersection of a row and a column, so that each set of four support elements 30 at adjacent intersections, such as support elements 30a, 30b, 30c and 30d defines a generally rectangular, and preferably square, zone 44. The directions referred to in this disclosure are directions in the frame of reference of the components themselves, rather than in the normal gravitational frame of reference. Horizontal directions are directions parallel to the plane of the first surface 24 of the test board 22, whereas vertical directions are perpendicular to that plane.

The package also includes flexible dielectric substrate 32, such as a polyimide or other polymeric sheet, including a top surface 34 and a bottom surface 36 remote therefrom. Although the thickness of the dielectric substrate will vary with the application, the dielectric substrate most typically is about 10 µm-100 µm thick. The flexible sheet 32 has conductive traces 38 thereon. In the particular embodiment illustrated in FIG. 4B, the conductive traces are disposed on the bottom surface 36 of the flexible sheet 32. However, in other embodiments, the conductive traces 38 may extend on the top surface 34 of the flexible sheet 32, on both the top and bottom faces or within the interior of flexible substrate 32. Thus, as used in this disclosure, a statement that a first feature is disposed "on" a second feature should not be understood as requiring that the first feature lie on a surface of the second feature. Conductive traces 38 may be formed from any electrically conductive material, but most typically are formed from copper, copper alloys, gold or combinations of these materials. The thickness of the traces will also vary with the application, but typically is about 5 µm-25 µm. Traces 38 are arranged so that each trace has a support end 40 and a post end 42 remote from the support end. In certain preferred embodiments, the flexible, dielectric substrate may have has an opening so as to enhance the flexibility of the flexible substrate.

The test assembly 20 preferably includes electrically conductive posts or pillars 46 that project from the top surface 34 of flexible substrate 32. Each post 46 is connected to the post end 42 of one of the traces 38. In the particular embodiment shown in FIGS. 4A-4B, the posts 46 extend upwardly through the dielectric sheet 32, from the post ends 42 of the traces 38. The dimensions of the posts can vary over a significant range, but most typically the height $h_p$ of each post above the top surface 34 of the flexible sheet is about 50-300 µm. Each post has a base 48 adjacent the flexible sheet 32 and a tip 50 remote from the flexible sheet. In the particular embodiment illustrated, the posts are generally frustoconical, so that the base 48 and tip 50 of each post are substantially circular. The bases of the posts are preferably about 100-600 µm in diameter, whereas the tips are preferably about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric sheet 32, traces 38 and posts 46 may be fabricated by a process such as that disclosed in co-pending, commonly assigned U.S. Provisional Patent Application Ser. No. 60/508,970, the disclosure of which is hereby incorporated by reference herein. As disclosed in greater detail in the '970 Application, a metallic plate is etched or otherwise treated to form numerous metallic posts projecting from the plate. A dielectric layer is applied to this plate so that the posts project through the dielectric layer. An inner face of the dielectric layer faces toward the metallic plate, whereas the outer face of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

Referring to FIG. 4A, the support ends 40 of the traces 38 are disposed in a regular grid pattern corresponding to the grid pattern of the support elements, whereas the posts 46 are disposed in a similar grid pattern. However, the grid pattern of the posts is offset in the first and second horizontal directions x and y from the grid pattern of the support ends 40 and support elements 30, so that each post 46 is offset in the −y and +x directions from the support end 40 of the trace 38 connected to that post.

The support end 40 of each trace 38 overlies a support element 30 and is bonded to such support element, so that each post 46 is connected to one support element. In the embodiment illustrated, where the support elements are solder balls, the bonds can be made by providing the support elements on the contacts 26 of the test board 24 and positioning the substrate or flexible sheet 32, with the posts and traces already formed thereon, over the support elements and reflowing the solder balls by heating the assembly. In a variant of this process, the solder balls can be provided on the support ends 40 of the traces. The process steps used to connect the support ends of the traces can be essentially the same used in flip-chip solder bonding of a chip to a circuit panel.

As mentioned above, the posts 46 are offset from the support elements 30 in the x and y horizontal directions. Unless otherwise specified herein, the offset distance $d_o$ (FIG. 4A) between a post and a support element can be taken as the distance between the center of area of the base 48 (FIG. 4B) of the post and the center of area of the upper end 52 (FIG. 4B) of the support element 30. In the embodiment shown, where both the base of the post and the upper end of the support element have circular cross-sections, the centers of area lie at the geometric centers of these elements. Most preferably, the offset distance $d_o$ is large enough that there is a gap 54 (FIG. 4A) between adjacent edges of the base of the post and the top end of the support element. Stated another way, there is a portion of the dielectric sheet 32 in gap 54, which is not in contact with either the top end 52 of the support element 30 or the base 48 of the post 46.

Each post lies near the center of one zone 44 defined by four adjacent support elements 30, so that these support elements are disposed around the post. For example, support elements 30a-30d are disposed around post 46a. Each post is electrically connected by a trace and by one of these adjacent support elements to the test board 22. The offset distances from a particular post to all of the support elements adjacent to that post may be equal or unequal to one another.

In the completed unit, the upper surface 34 of the substrate or flexible sheet 32 forms an exposed surface of the package, whereas posts 46 project from this exposed surface and provide terminals for connection to external elements.

The conductive support elements 30 create electrically conductive paths between the test board 22 and the flexible substrate 32 and traces 38. The conductive support elements space the flexible substrate 32 from the first face 24 of the test board 22. As further discussed below, this arrangement facilitates movement of the posts 46.

Figure 2:
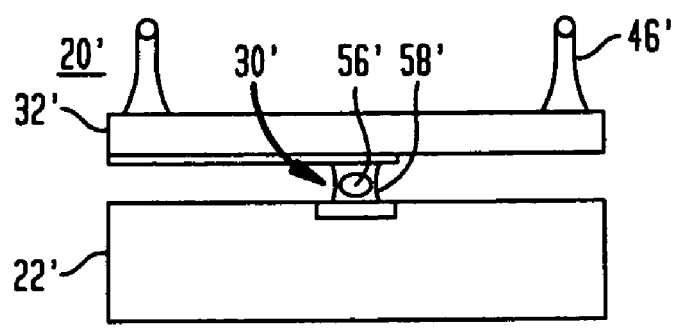
FIG. 2 shows a cross-sectional view of an assembly, in accordance with other preferred embodiments of the present invention.

Referring to FIG. 2, a testing assembly 20' in accordance with another preferred embodiment of the present invention includes test board 22', dielectric substrate 32' and conductive posts 46' projecting from the dielectric substrate. The assembly also includes conductive support elements 30' having a core 56' covered by an outer conductive coating 58'. Core 56' may be a conductive, high-melting material such as copper, whereas coating 58' may be a lower-melting material such as a solder. Alternatively, core 56' may be formed from a non-conductive material such as glass, ceramic or a polymer.

Figure 3:
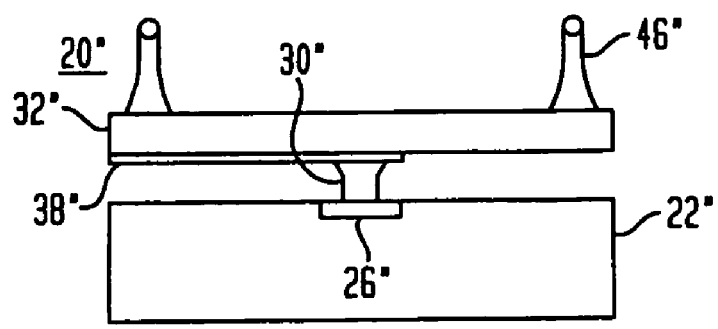
FIG. 3 shows a cross-sectional view of an assembly, in accordance with further preferred embodiments of the present invention.

Referring to FIG. 3, a testing assembly 20" in accordance with yet another preferred embodiment of the present invention includes test board 22", dielectric substrate 32" and conductive posts 46" projecting from the dielectric substrate. The assembly also has conductive support elements 30" including elongated conductive pillars 30". These pillars may be formed integrally with traces 38" and conductive posts 46". The tips of the conductive pillars 30" abut the conductive pads 26" of the test board 22", and may be bonded to the contacts by a solder, eutectic bonding material, diffusion bond or other metallurgical bond.

Figure 5A:
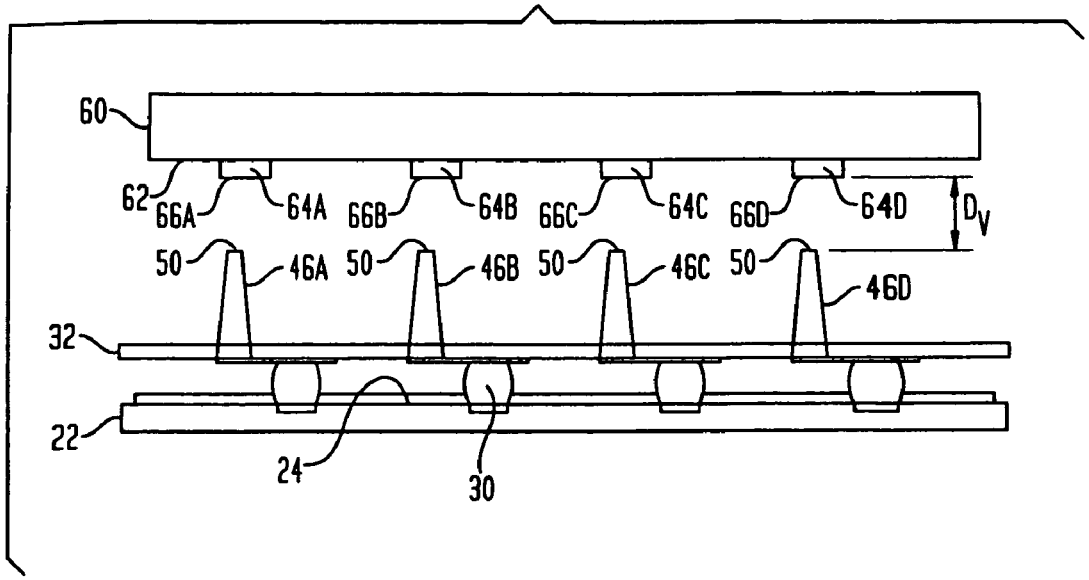
FIG. 5A shows a front elevational view of the testing assembly of FIGS. 4A-4B during a method of testing a microelectronic element, in accordance with one preferred embodiment of the present invention.
Figure 5B:
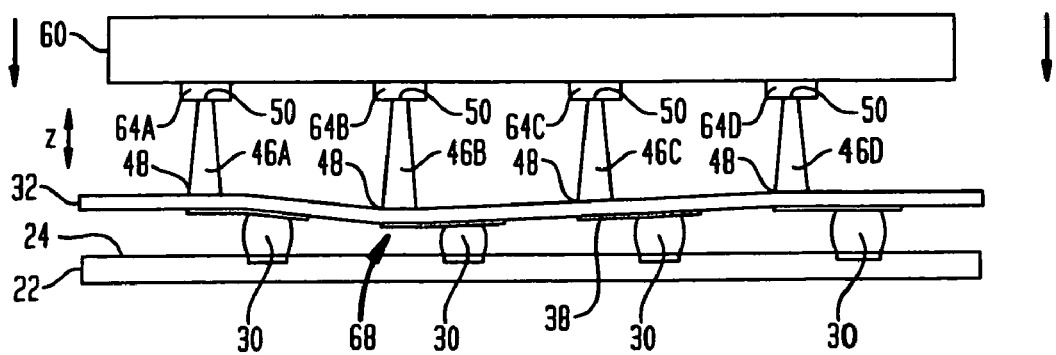
FIG. 5B shows the testing assembly of FIG. 5A during a later stage of testing the microelectronic element.

FIGS. 5A and 5B show a method of testing a microelectronic element 60 using the testing assembly 20 shown and described above in FIGS. 1A-1C and 4A-4B. The microelectronic element 60, such as a semiconductor chip, has a front face 62 including contacts 64 accessible at the front face and a rear face 66 remote therefrom. In order to test the microelectronic element 60, the contacts 64 of the microelectronic element are juxtaposed with the conductive posts 46 of the test board 22. The contacts 64A-64D are placed in substantial alignment with top surfaces 50 of the respective conductive posts 46A-46D. As is evident in the drawing figure, the top surfaces 66A-66D of the respective contact pads 64A-64D are disposed at different heights and do not lie in the same plane. Such non-planarity can arise from causes such as warpage of the microelectronic element 60 itself and unequal thicknesses of contact pads 64. Also, although not shown in FIG. 5A, the tips 50 of the posts 46 may not be precisely coplanar with one another, due to factors such as unequal heights of support elements 30; non-planarity of the first surface 24 of the test board 22; warpage of the dielectric substrate 32; and unequal heights of the posts themselves. Also, the microelectronic element 60 may be tilted slightly with respect to the test board. For these and other reasons, the vertical distances Dv between the contacts 64 and the tips of the posts 46 may be unequal.

Referring to FIG. 5B, the microelectronic element 60 is moved toward the test board 22, by moving the test board, the microelectronic element or both toward one another. The contacts 64 engage the conductive posts 46A-46D for making electrical contact with the conductive posts. The tips 50 of the posts 46A-46D are able to move so as to compensate for the initial differences in vertical spacing Dv (FIG. 5A), so that all of the tips can be brought into contact with all of the contact pads simultaneously using with only a moderate vertical force applied to urge the microelectronic element 60 and the test board 22 together. In this process, at least some of the post tips 46A-46D are displaced in the vertical or z direction relative to others of the post tips.

A significant portion of this relative displacement arises from movement of the bases 48 of the posts relative to one another and relative to test board 20. Because the posts are attached to flexible substrate 32 and are offset from the support elements 30, and because the support elements space the flexible substrate 32 from the first surface 24 of the test board, the flexible substrate 32 can deform. Further, different portions of the substrate associated with different posts can deform independently of one another. As pressure is applied by contacts 64 onto the posts 46, the support elements 30 allow region 68 of flexible substrate 32 to bend downwardly toward the test board 22, allowing the base 48 of post 46B to also move downward toward the test board. This deformation is idealized in FIG. 5B as a pure displacement of the post and the center of the region in the vertical or z direction. In practice, the deformation of the substrate 32 may include bending and/or stretching of the substrate so that the motion of the base may include a tilting about an axis in the x-y or horizontal plane as well as some horizontal displacement of the base, and may also include other components of motion. For example, one portion of the region may be reinforced by a conductive trace (not shown), which will tend to be stiffer than the other portions of the region. Also, a particular post may be positioned off-center in its region 68, so that the post lies closer to one support element 30, or to a pair of support elements, on one side of the post. For example, post 46a (FIG. 4A) may be disposed closer to support elements 30a and 30b than to support elements 30c and 30d. The relatively small portion of the substrate between the post and support elements 30a and 30b will be stiffer in bending than the relatively large portion of the substrate between the posts and support elements 30c and 30d. Such non-uniformities tend to promote non-uniform bending and hence tilting motion of the posts. Tilting of the posts tends to move the tips 50 toward the test board 22. The support elements 30 at the corners of the individual regions substantially isolate the various regions from one another, so that the deformation of each region is substantially independent of the deformation of other regions of the flexible, dielectric substrate 32. Depending on the configuration of the posts, the posts 46 themselves may also flex or buckle to some degree, which provides additional movement of tips 50 in the vertical or z direction.

Referring to FIG. 5B, the independent displacement of the posts 46 relative to one another allows all of the contacts 64 of the microelectronic element 60 to contact all of the post tips 50 on the test board 22. For example, the flexible substrate 32 in the vicinity of conductive post 46B flexes substantially more than the flexible substrate in the vicinity of conductive post 46C. In turn, the flexible substrate 32 in the vicinity of conductive post 46C flexes substantially more than the flexible substrate in the vicinity of conductive post 46D.

Because all of the contacts 64 can be engaged reliably with all of the post tips 50, the microelectronic element 60 can be tested reliably by applying test signals, power and ground potentials through the test board 22 and through the engaged contacts and posts.

The test circuit board can be made using the techniques commonly employed to form ordinary circuit boards. The test circuit board may incorporate electronic elements such as capacitors in close proximity to the contact pads as required for certain high-frequency signal processing circuits. The internal features of the microelectronic element 60 are also compatible with high-frequency signals. The conductive support elements 30, traces 38 and posts 46 provide low-impedance signal paths between the tips 50 of the posts and the contacts 64 of the microelectronic element 60. Because each post 46 is connected to an immediately adjacent conductive support element 30, traces 38 may be quite short. The low-impedance signal paths are particularly useful in high-frequency operation, as, for example, where the microelectronic element must send or receive signals at a frequency of 300 MHz or more.

After testing, the microelectronic element 60 may be removed from the testing assembly 20 and packaged using an interposer such as a circuitized, dielectric film. The microelectronic package, such as a ball grid array package, may be connected with contact pads on a circuit panel using a conductive bonding material such as solder. The solder-bonding process may be performed using conventional equipment commonly used for surface-mounting microelectronic components. Thus, the solder masses may be provided on the terminals of the microelectronic package, and may be reflowed after engaging the terminals with the conductive pads.

Figure 6:
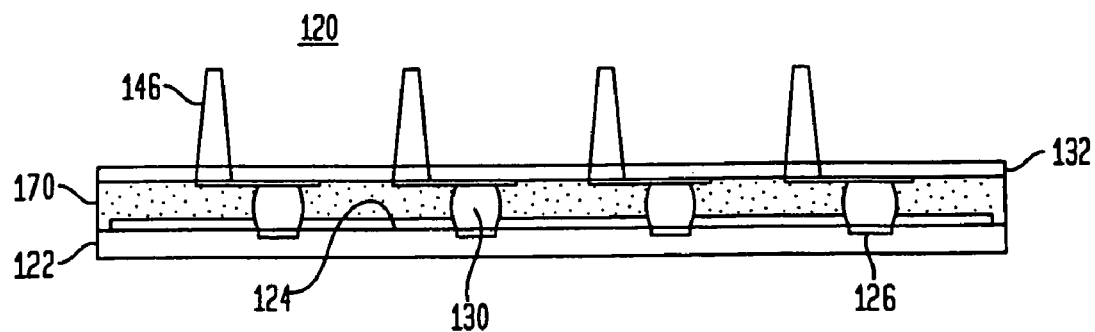
FIG. 6 shows a cross-sectional view of an assembly for testing microelectronic elements, in accordance with still further preferred embodiments of the present invention.

Referring to FIG. 6, in certain preferred embodiments of the present invention, a testing assembly 120 has a compliant material 170 positioned between a flexible substrate 132 and a test board 122. The compliant material layer 170 preferably does not substantially restrict movement of conductive posts 146. The compliant material desirably prevents contaminants from entering the testing assembly 120. Merely by way of example, the compliant material 170 may be a gel, foam or the like. Despite the presence of the compliant material, conductive elements 130 still support the flexible substrate 132 to a substantial degree.

Figure 7:
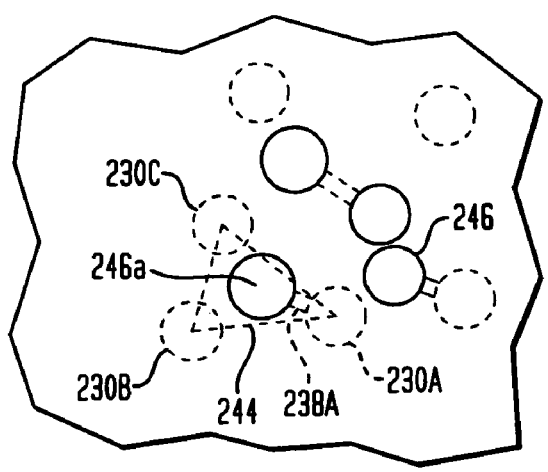
FIGS. 7 and 8 are fragmentary plan views similar to FIG. 4A but depicting packages according to further preferred embodiments of the present invention.

Numerous further variations and combinations of the features discussed above can be used. For example, where the conductive pads on a test board are disposed in an array, such array need not be a rectilinear, regular array as shown in FIG. 4A. For example, as shown in FIG. 7, the conductive pads and support elements 230 may be disposed in an irregular pattern or in a hexagonal or triangular array. In the particular pattern of FIG. 7, post 246a lies in a region 244 bounded by three support elements 230a, 230b and 230c, and is electrically connected to one of these support elements by a trace 238a.

Figure 8:
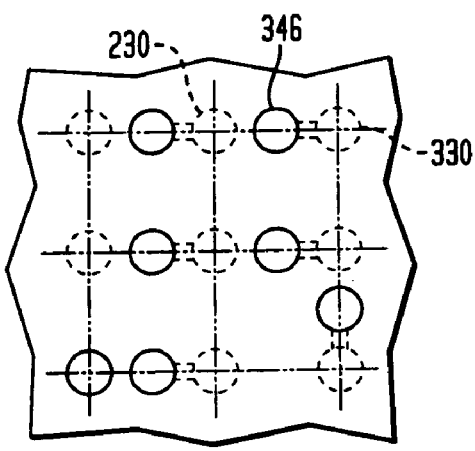

In a further preferred embodiment of the present invention, shown in FIG. 8, the support elements 330 are arranged in rectilinear rows and columns, but the posts 346 are disposed in the rows or columns such that each post lies between two adjacent support elements 230. Moreover, it is not essential to have a one-to-one association between posts, traces and support elements. For example, a given post may be connected by two or more traces to two or more posts. Conversely, a given support element may be electrically connected to two or more posts. In yet another variant, one or more of the posts may be electrically connected to support elements remote from such posts. Also, the flexible substrate may include elements such as conductive planes that serve as ground planes or power distribution planes.

Figure 9:
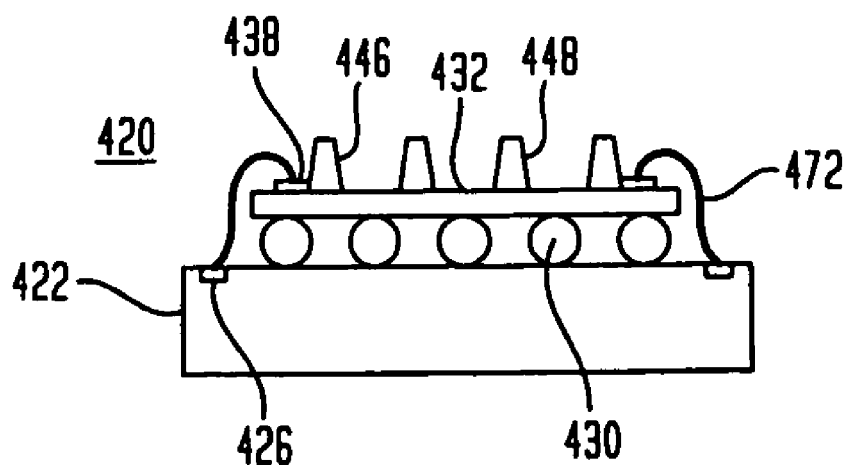
FIGS. 9 and 10 are diagrammatic sectional view depicting packages according to still further preferred embodiments of the invention.

The support elements need not be electrically conductive. For example, as shown in the preferred embodiment of FIG. 9, a testing assembly 420 includes a flexible support substrate 432 supported over the first face 424 of a test board 422 by support elements 430 that are formed from a dielectric material as, for example, small spheres of glass or polymer. The conductive traces 438 on the flexible substrate 432, and hence the posts 446, are electrically connected to the conductive pads 426 of the test board 422 by wire bonds 472. As described above, the conductive posts 446 are offset from the support elements 430 so that the bases 448 of the posts 446 can move upon flexure of the flexible, dielectric substrate 432. In certain preferred embodiments of the present invention, some of the conductive pads on the test board are disposed in one or more rows adjacent the center of the test board (not shown), whereas others are disposed in rows adjacent the edges of the test board. In a further variant (not shown), the conductive pads of the test board are connected to the traces by leads formed integrally with the traces. Leads preferably extend to center conductive pads on the test board through a slot or hole in the flexible, dielectric substrate. Alternatively, two separate substrates may be positioned on opposite sides of the center contact row.

Figure 10:
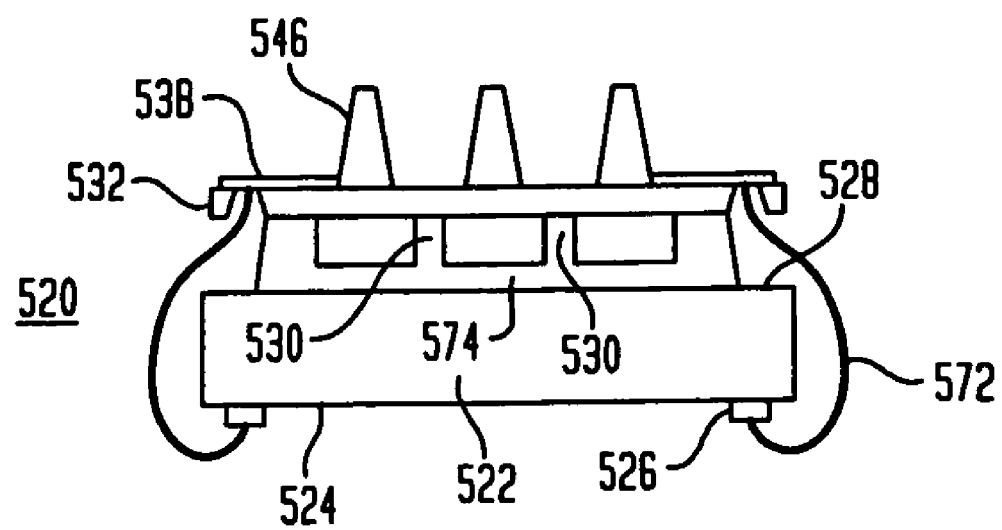

Referring to FIG. 10, in another preferred embodiment of the present invention, a testing assembly 520 includes a flexible substrate 532 that is supported over a second or rear surface 528 of a test board 522, opposite from the first surface 524 having the conductive pads 526. Stated another way, the test board 522 is "face-up" relative to flexible substrate 532. The traces 538, and hence the conductive posts 546, are electrically connected to the conductive pads 526 by leads 572 such as wire bonds or leads integral with the traces. As described above, the conductive posts 546 are offset from support elements 530 so that in this embodiment as well, movement of the posts 546 is facilitated by flexing of the substrate 532 between the support elements 530. In the embodiment of FIG. 10, support elements 530 are nonconductive and are formed as portions of a continuous layer 574. Merely by way of example, such a continuous layer with projecting support elements may be formed by molding or embossing a polymeric layer.

Figure 11A:
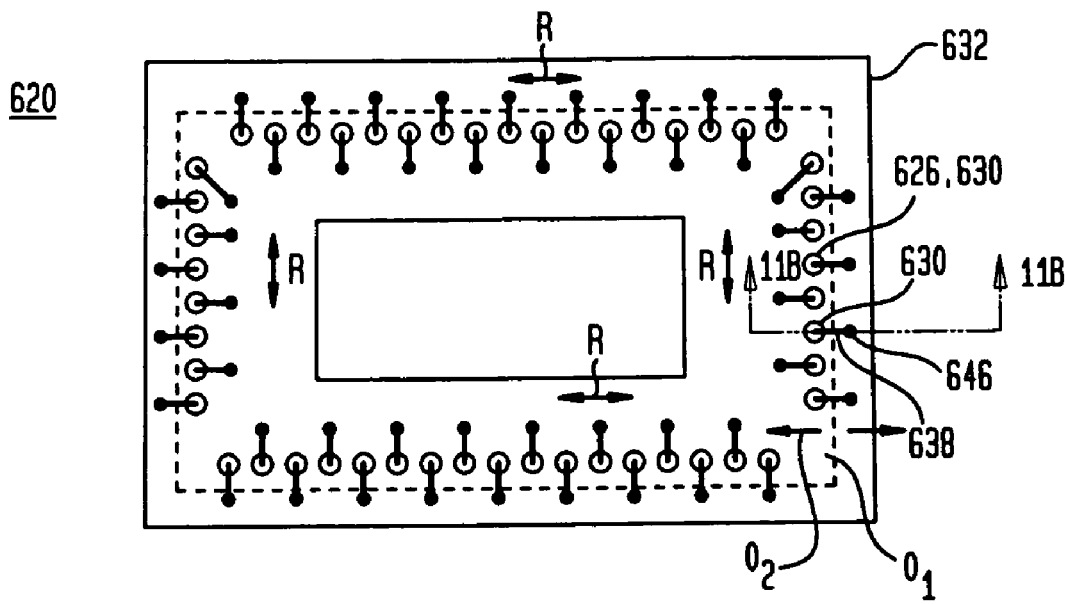
FIG. 11A is a diagrammatic top plan view of a package in accordance with another embodiment of the invention.
Figure 11B:
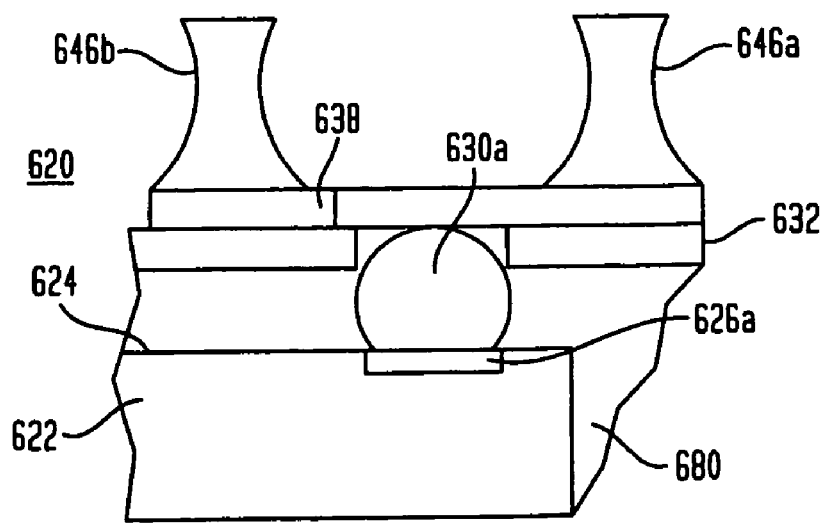
FIG. 11B is a fragmentary, diagrammatic sectional view taken along line 11B-11B in FIG. 11A.

Referring to FIGS. 11A and 11B, in another preferred embodiment of the present invention, a testing assembly 620 includes a test board 622 having conductive pads 626 disposed in rows, each such row extending in a row direction R. Each row is preferably disposed adjacent to an edge of the test board 622 and conductive support elements 630 are provided on the conductive pads 626. The conductive support elements 630 may be in the form of studs rather than solder balls. As is well known to those skilled in the art of microelectronic devices, studs are small conductive elements applied in a process commonly referred to as "stud bumping." For example, each stud may include a small mass of a metal such as gold or aluminum. The stud bumping process may be performed using equipment similar to that employed in wire bonding. The bonding tool typically carries a small ball of the metal, and bonds the ball to the chip contact using heat, sonic vibrations, pressure or some combination of these. In other stud bumping techniques, numerous stud bumps are applied to numerous contacts simultaneously. The stud bumping process can be performed on a wafer, prior to subdividing the wafer into individual chips.

In the embodiment of FIGS. 11A and 11B, the conductive posts 646 are disposed on a flexible dielectric substrate 632 carrying traces 638. The conductive posts 646 are disposed in rows that extend generally parallel to the rows of the conductive pads 626 and support elements 630. However, the posts 646 associated with each row of conductive pads and support elements are offset from the support elements in the row in opposite directions transverse to the row direction. Thus, a first conductive post 646a is offset from the row in one direction $O_1$ (to the right as seen in FIG. 11B) and a second conductive post 646b is offset in the opposite direction $O_2$ (to the left as seen in FIG. 11B). The opposite offsets split the conductive posts 646 associated with each row of contacts and support elements into two rows, one such row of posts lying inboard of the row of support elements 630 and the other such row of posts lying outboard of the row of support elements 630. This arrangement increases the spacing between adjacent posts. In certain preferred embodiments, the spacing, on average, will be about twice the spacing between adjacent conductive pads on the test board. This is advantageous in that it allows for larger contacts on the chip or other substrate to which the testing assembly will be engaged and also decreases the precision required in placing the testing assembly onto a chip or microelectronic element. Moreover, placing the posts associated with each row of conductive pads and support elements on opposite sides of the row of conductive pads and support elements minimizes shear loads in horizontal directions applied to the conductive support elements when the posts are engaged with contacts on a microelectronic element. Forces applied to the tips of the posts tending to bend the substrate 632 and traces 638 may also place the substrate in tension, and may apply horizontally directed forces to the support elements. However, the horizontally directed forces applied by posts on opposite sides of the row of support elements (such as by posts 436a and 436b) tend to balance one another. Stated another way, each support element 630 lies between conductive posts.

In the particular embodiment of FIGS. 11A and 11B, the flexible, dielectric substrate 632 extends outwardly beyond the edges of test board 622, and the conductive posts disposed outboard of the contacts (e.g., post 646a) are disposed in whole or in part beyond the edges of the test board. To provide additional support for these posts, a support element (not shown) may encircle the test board 622. Alternatively or additionally, an encapsulant 680 (FIG. 11B) may be provided around the edges of the test board, and between the first face 624 of the test board and the flexible substrate 632.

Figure 12A:
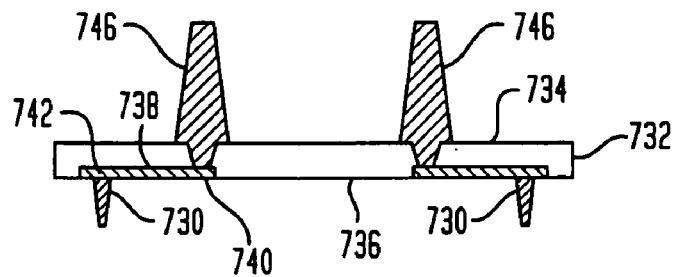
FIGS. 12A-12C show a method of making an assembly including a flexible substrate having conductive posts, in accordance with certain preferred embodiments of the present invention.

Referring to FIG. 12A, a microelectronic assembly in accordance with another preferred embodiment of the present invention includes an interposer having a flexible dielectric substrate 732 with a first surface 734 and a second surface 736 remote therefrom. The interposer includes first conductive posts 746 projecting upwardly from the first surface 734 of the flexible substrate 732 and second conductive posts 730 projecting downwardly from flexible substrate 732. The first and second conductive posts 746, 730 are electrically interconnected using conductive traces 738 having first ends 740 attached to second conductive posts 730 and second ends 742 attached to first conductive posts 746.

Figure 12B:
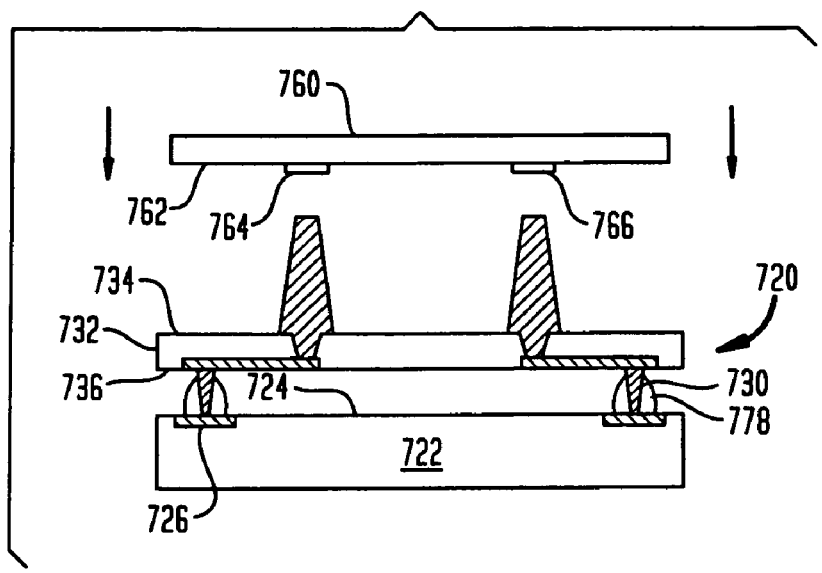

Referring to FIG. 12B, the interposer may be assembled with a test board 722 by juxtaposing the second surface 736 of the flexible substrate 732 with the active surface 724 of test board 722. The second conductive posts 730 are electrically interconnected with the conductive pads 726 of the test board 722. In certain preferred embodiments, the second posts 730 are electrically interconnected to the conductive pads 726 using a fusible conductive material such as solder 778. A filler material (not shown), such as a compliant layer of dielectric encapsulant, may be provided between the flexible substrate 732 and the test board 722.

Figure 12C:
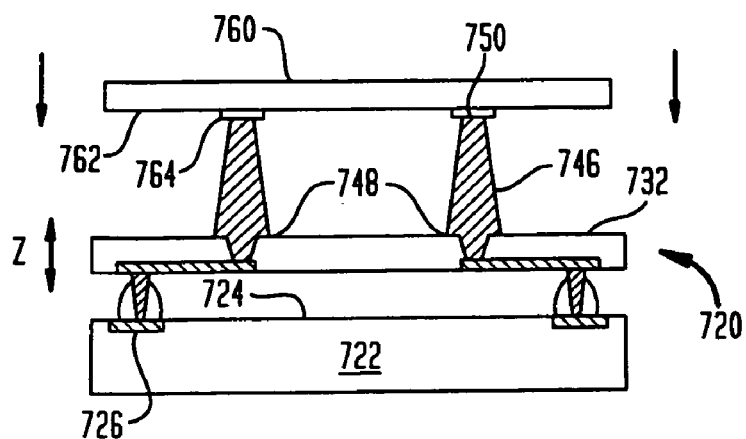

The combination of the interposer and the test board 722 form a testing assembly 720 that may be used for testing microelectronic elements such as semiconductor chips and microelectronic packages. Referring to FIG. 12C, the testing assembly 720 is used for testing a semiconductor chip 760 having a first surface 762 including contacts 764. In order to test the chip, the contacts 764 are abutted against the tip ends 750 of the first conductive posts 746. The contacts 764 are placed in substantial alignment with top surfaces 750 of the conductive posts 746. Top surfaces 766 of the contacts 764 may be disposed at different heights and do not lie in the same plane. Such non-planarity can arise from causes such as warpage of the chip 760 and/or unequal thickness of the contact 764. In addition, the tips 750 of the first conductive posts 746 may not be precisely coplanar with one another, due to factors such as unequal heights of the second conductive posts 730; non-planarity of the first surface 724 of the test board 722; warpage of the flexible substrate 732; tilting of the chip 760 with respect to the test board 722; and unequal heights of the first conductive posts 746 themselves. For these and other reasons, the vertical distances between the contacts 764 and the tips 750 of the posts 746 may be unequal.

Referring to FIGS. 12B and 12C, the microelectronic element 760 is moved toward the test board 722, by moving the test board, the microelectronic element or both toward one another. The contacts 764 engage the first conductive posts 746 for making electrical contact with the conductive posts. The tips 750 of the posts 746 are able to move so as to compensate for the initial differences in vertical spacing so that all of the tips can be brought into contact with all of the contacts simultaneously using with only a moderate vertical force applied to urge the microelectronic element 760 and the test board 722 together. In this process, at least some of the tips of the first conductive posts 746 are displaced in the vertical or z direction relative to others of the post tips.

A significant portion of this relative displacement arises from movement of the bases 748 of the first conductive posts 746 relative to one another and relative to test board 720. Because the first conductive posts 746 are attached to flexible substrate 732 and are offset from the second conductive posts 730, and because the second conductive posts 730 space the flexible substrate 732 from the first surface 724 of the test board 722, the flexible substrate 732 can deform. Further, different portions of the flexible substrate 732 associated with different posts can deform independently of one another. As pressure is applied by contacts 764 onto the first conductive posts 746, the misalignment of the second conductive posts 730 relative to the first conductive posts allows one or more regions of the flexible substrate 732 to bend toward the test board 722, allowing the bases 748 of the first conductive posts 746 to also move downward toward the test board. In practice, the deformation of the substrate 732 may include bending and/or stretching of the substrate so that the motion of the base may include a tilting about an axis in the x-y or horizontal plane as well as some horizontal displacement of the base, and may also include other components of motion.

Referring to FIG. 12C, the independent displacement of the first conductive posts 746 relative to one another allows all of the contacts 764 of the microelectronic element 760 to contact all of the tips 750 of the first conductive posts 746 on the test board 722. Because all of the contacts 764 of the chip 760 can be engaged reliably with all of the post tips 750 of the first conductive posts 746, the microelectronic chip 760 can be tested reliably by applying test signals, power and ground potentials through the test board 722 and through the engaged contacts and posts.

Figure 13A:
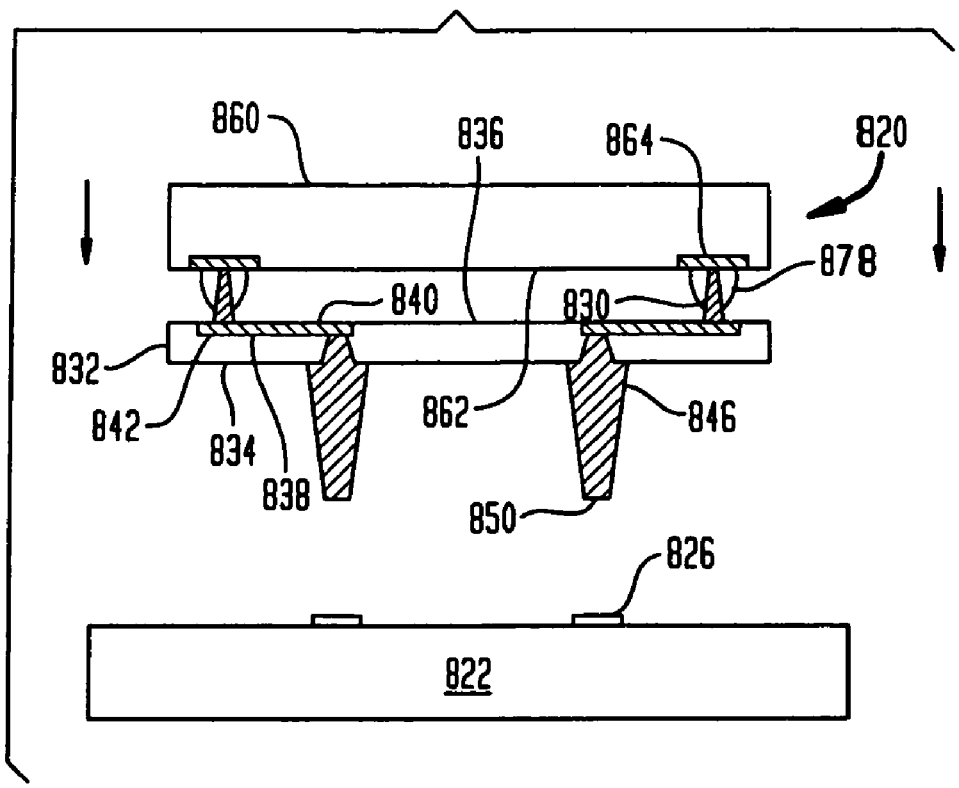
FIGS. 13A-13B show a method of testing an assembly including a flexible substrate having conductive posts, in accordance with another preferred embodiment of the present invention.
Figure 13B:
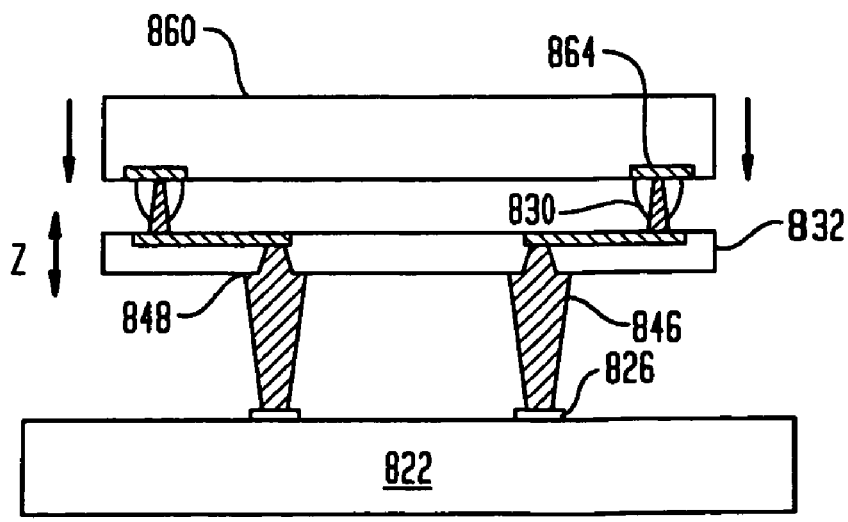

FIGS. 13A and 13B show a microelectronic assembly in accordance with another preferred embodiment of the present invention with the above-described flexible interposer being assembled with a microelectronic element 860 to form a testable microelectronic package 820. Referring to FIG. 13A, the testable package 820 includes a microelectronic element, such as a semiconductor chip 860, having a first face 862 including contacts 864. The testable package 820 also includes a flexible interposer having a flexible, dielectric substrate 832 with a first surface 834 facing away from microelectronic element 860 and a second surface 836 facing toward the microelectronic element 860. The flexible interposer includes first conductive posts 846 that project from the first surface 834 of flexible substrate 832 and away from chip 860. The first conductive posts 846 include tip ends 850 at lower ends thereof. The substrate 832 also includes second conductive posts 830 that project from the second surface 836 of the substrate and toward the chip 860. The second conductive posts 830 may be electrically interconnected with contacts 864 by a conductive material 878 such as solder. The first and second conductive posts 846, 830 are desirably electrically interconnected with one another through conductive traces 838 that are provided on flexible substrate. The conductive traces 838 have first ends 840 that are connected with first conductive posts 846 and second ends 842 that are connected with second conductive posts 830.

The testable package 820 may be tested by substantially aligning the first conductive posts 846 with conductive pads 826 of a test board 822 and abutting the tip ends 850 of the first conductive posts 846 against the conductive pads 826 as shown in FIG. 13B. As described above in earlier embodiments, the first conductive posts 846 are free to move independently of other first conductive posts so as to ensure reliable contact between each first conductive post 846 and each conductive pad 826 on test board 822. The tips 850 of the first conductive posts 846 are able to move so as to compensate for potential differences in vertical spacing so that all of the tips can be brought into contact with all of the conductive pads simultaneously using with only a moderate vertical force applied to urge the testable package 820 and the test board 822 together. In this process, at least some of the tips 850 of the first conductive posts 846 are displaced in the vertical or z direction relative to others of the post tips. Further, different portions of the flexible substrate 832 associated with different first conductive posts 846 can deform independently of one another. As pressure is applied by contacts 864 onto the second conductive posts 830, misalignment of the first conductive posts 846 relative to the second conductive posts 830 allows one or more regions of the flexible substrate 832 to bend toward the test board 822, allowing the bases 848 of the first conductive posts 846 to move toward the chip 860. In practice, the deformation of the substrate 832 may include bending and/or stretching of the substrate so that the motion of the base may include a tilting about an axis in the x-y or horizontal plane as well as some horizontal displacement of the base, and may also include other components of motion.

Figure 14A:
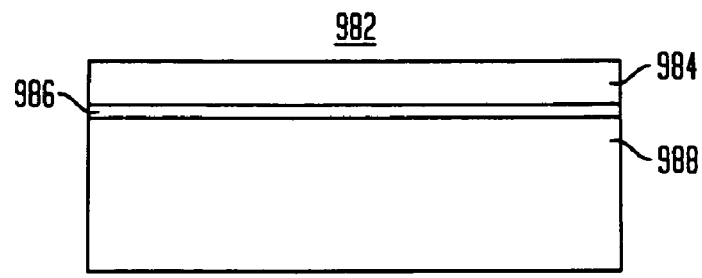
FIGS. 14A-14F show a method of making a flexible substrate having conductive posts, in accordance with yet another preferred embodiment of the present invention.
Figure 14B:
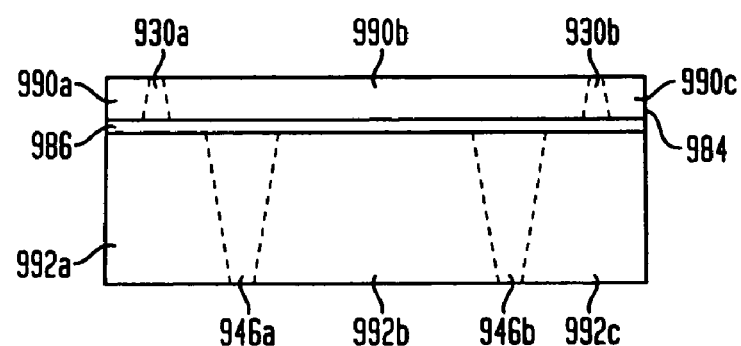
Figure 14C:
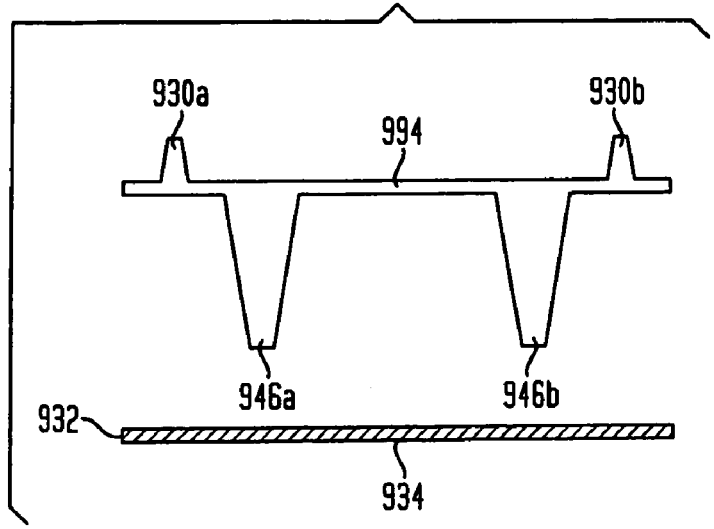
Figure 14D:
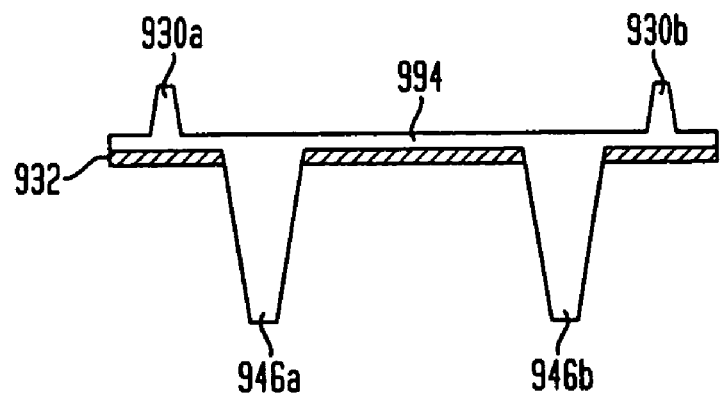

FIGS. 14A-14F show a method for making the testable assembly shown in FIG. 13, in accordance with certain preferred embodiments of the present invention. In one particular preferred embodiment, the testable assembly may be fabricated by a process such as that disclosed in co-pending, commonly assigned U.S. Provisional Application No. 60/508,970, the disclosure of which is hereby incorporated by reference herein. As disclosed in certain preferred embodiments of the '970 application, a metallic plate 982 a top layer 984 made of a conductive material, an intermediate etch stop layer 986 and a bottom layer 988 made of a conductive material. The top and bottom layers 984, 988 may include electrically conductive materials such as copper. The intermediate etch stop layer 986 may include materials such as nickel. Referring to FIGS. 14A and 14C, the top layer 984 of metallic plate 982 is stamped or etched to remove portions 990a, 990b, 990c of top layer 984 so as to form second conductive posts 930a, 930b. The bottom layer 988 may also be stamped or etched to remove portions 992a, 992b and 992c to form first conductive posts 946a, 946b. Referring to FIG. 14C, after the conductive posts 930, 946 have been formed, the etch stop layer 986 is removed by a process that leaves a thin layer of conductive material 994 that is connected with the conductive posts 930, 946 in place. One preferred method for removing the etch stop layer includes a chemical etching process. Referring to FIGS. 14C and 14D, a flexible dielectric substrate 932 such as a polyimide film is assembled with the thin conductive layer 994 so that the first conductive posts 946a, 946b project through the dielectric substrate 932. A first face 934 of the dielectric substrate 932 faces away from the thin conductive layer 994 and a second face 936 of the dielectric substrate 932 faces toward the thin conductive layer 994. The dielectric substrate 932 may be fabricated by coating a dielectric layer such as a polyimide onto the thin layer 994 and around the conductive posts, or more typically, by forcibly engaging the conductive posts with the dielectric substrate so that the posts penetrate through the substrate. Although the thickness of the dielectric substrate will vary with the application, the dielectric substrate most typically is about 15-100 μm thick.

Figure 14E:
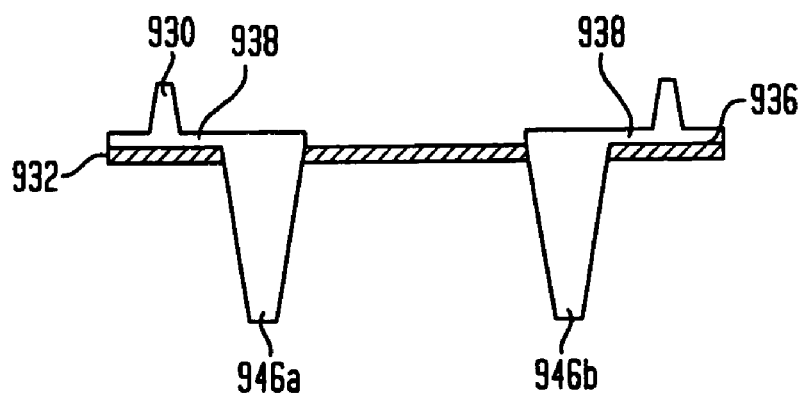

Referring to FIGS. 14D and 14E, once the dielectric substrate 932 is in place, portions of the thin conductive layer 994 are etched to form individual conductive traces 52 on the second face 936 of the dielectric substrate 932.

In the particular embodiment illustrated in FIGS. 14D-14E, the flexible dielectric substrate 932 is assembled with thin conductive layer 994 before the thin layer 994 is treated. However, in other embodiments, the flexible dielectric substrate 932 may be attached to the thin layer 994 after the conductive traces 938 have been formed or at a later process step. Alternatively, conventional processes such as plating may form the conductive traces 938. An etching process may also be used, whereby the first and second conductive posts may be formed using the methods disclosed in commonly assigned U.S. Pat. No. 6,177,636, the disclosure of which is hereby incorporated by reference herein. In yet other preferred embodiments, the conductive posts may be fabricated as individual elements and assembled to the flexible dielectric substrate in any suitable manner that connects the conductive posts to the conductive traces. As used herein, the terminology "conductive terminal" may also mean a conductive bump, or a conductive post having a height significantly greater than its width.

Figure 14F:
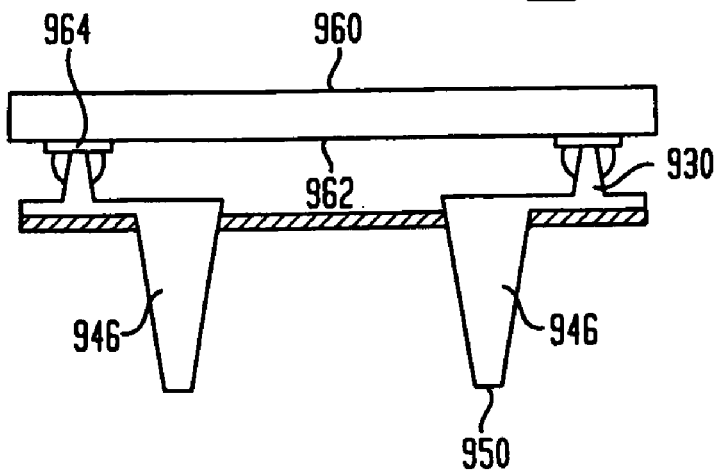

Referring to FIG. 14F, the subassembly of FIG. 14E may then be assembled with a microelectronic element 960 having a first face with contacts 964 so as to form a microelectronic package 920. During assembly, the second conductive posts 930 may be connected with contacts 964 using conductive material 978 such as solder. The package 920 may be tested by abutting tip ends 950 of first conductive posts 946 against conductive pads or contacts on another microelectronic element (not shown). The first conductive posts 946 are free to move independently of one another and relative to the first surface 962 of chip 960 so as to accommodate conductive pads (not shown) that oppose tip ends 950 of first conductive posts 946.

Figure 15A:
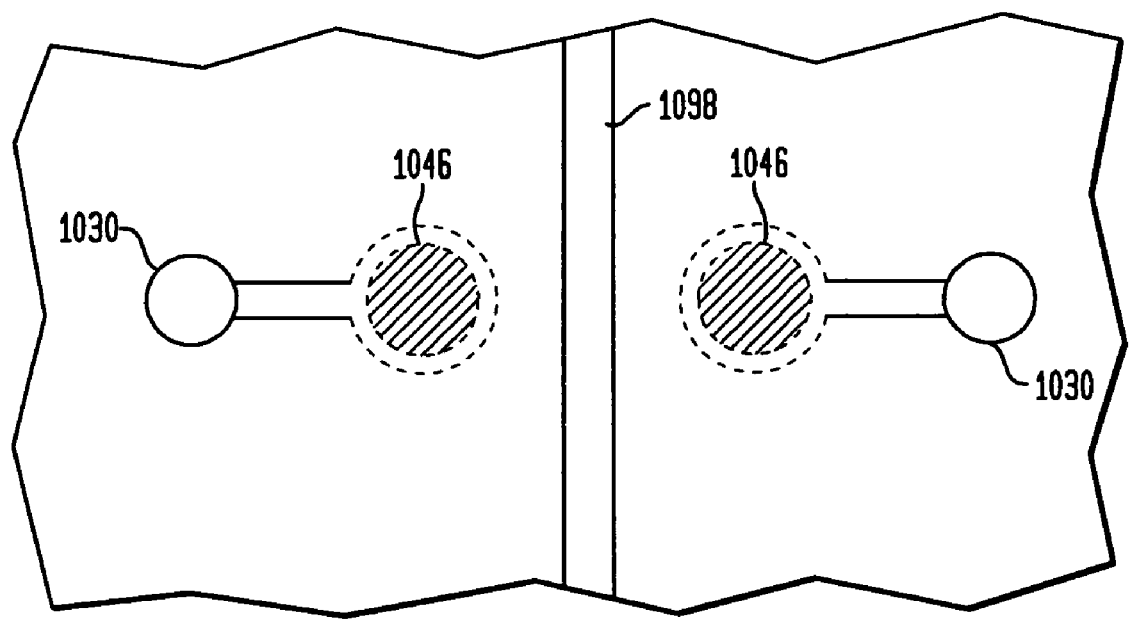
FIG. 15A shows a sectional view of an assembly, in accordance with another preferred embodiment of the present invention.
Figure 15B:
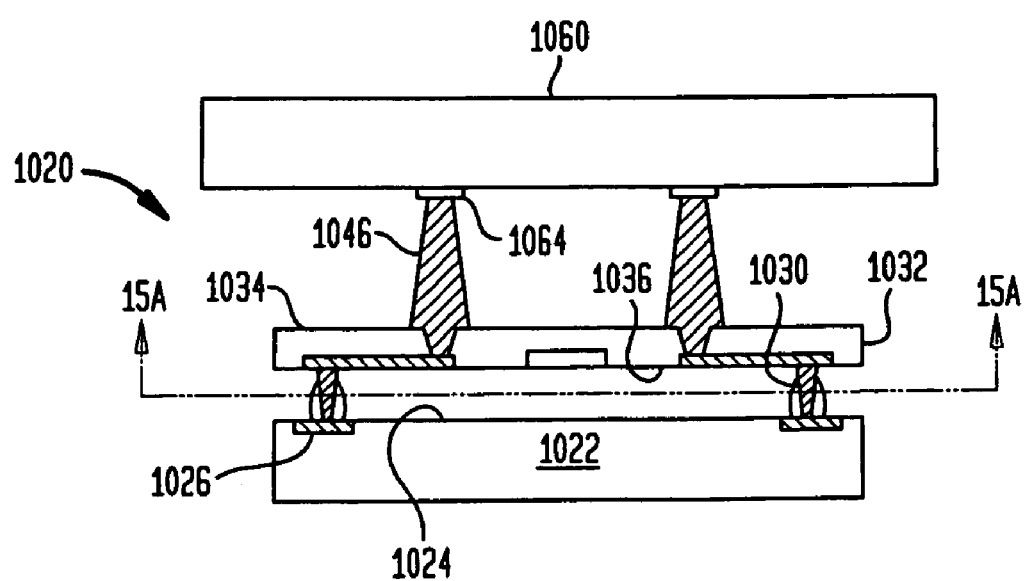
FIG. 15B shows another sectional view of the assembly shown in FIG. 15A.

Referring to FIGS. 15A-15B, testing assembly 1020 includes a test board 1022 having a first face 1024 with contacts 1026. The assembly 1020 includes flexible substrate 1032 having a first surface 1034 and a second surface 1036 that faces toward the first surface 1024 of test board 1022. The substrate 1032 includes first conductive posts 1046 projecting from the first surface 1034 of the substrate 1032 and second conductive posts 1030 projecting from the second surface 1036 of the flexible substrate 1032. The second conductive posts are electrically connected with the conductive pads 1026 of the test board 1022. In operation, the testing assembly 1020 may be used for testing microelectronic elements such as a chip 1060 having contacts 1064. Using the first conductive posts 1046 for forming an electrical interconnection with the chip 1060 enables connections to be made at smaller pitches, which leaves sufficient room of the substrate 1032 for one or more conductive traces 1098 to be routed between the first conductive posts 1046.

The foregoing discussion has referred to an individual microelectronic element. However, the package may include more than one microelectronic element or more than one substrate. Moreover, the process steps used to assemble the flexible substrate, the support elements and the posts to chips may be performed while the chips are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step. The ability of the packages to compensate for non-planarity in a test board or in the wafer itself greatly facilitates testing of a large unit.

Figure 16:
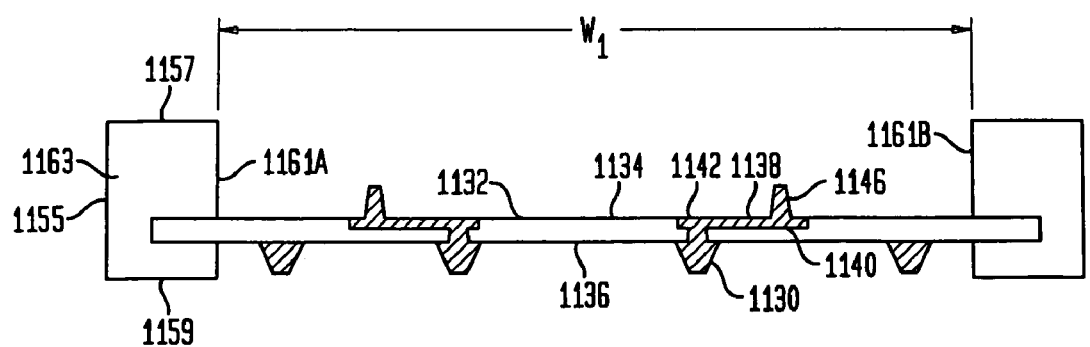
FIG. 16 shows a cross-sectional view of a subassembly for a test socket, in accordance with certain preferred embodiments of the present invention.

Referring to FIG. 16, a test socket subassembly includes a dielectric substrate 1132, such as a flexible dielectric substrate or a flexible dielectric tape, having a top surface 1134 and a bottom surface 1136 remote therefrom. The test socket subassembly also includes first conductive posts 1146 projecting above the top surface 1134 of the dielectric substrate 1132 and second conductive posts 1130 projecting from the bottom surface 1136 of the dielectric substrate 1132. In certain preferred embodiments, some of the first conductive posts 1146 are electrically interconnected with some of the second conductive posts 1130. The first and second conductive posts 1146, 1130 may be electrically interconnected by conductive traces 1138 having first ends 1140 electrically interconnected with first conductive posts 1146 and second ends 1142 electrically interconnected with second conductive posts 1130. The test socket subassembly also includes a support frame 1155 having a top surface 1157, a bottom surface 1159, an inner surface 1161, and an outer surface 1163. The support frame is preferably made of a sturdy material that is capable of supporting the substrate 1132. The frame 1155 preferably supports an outer perimeter of the flexible substrate 1132. Preferred materials for the support frame 1155 may include metal, ceramic and polymers. The opposing inner surfaces 1161A, 1161B of the support frame 1155 preferably define an opening for the test socket subassembly having a width $W_1$. In certain preferred embodiments, a distance between the bottom surface 1159 of frame 1155 and the second surface 1136 of dielectric substrate 1132 is approximately equal to the height of the second conductive posts 1130.

Figure 17:
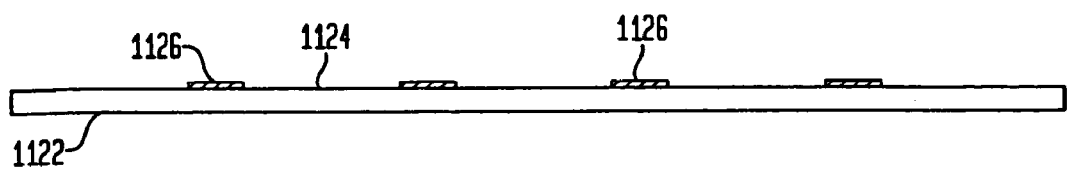
FIG. 17 shows a cross-sectional view of a second subassembly for a test socket, in accordance with certain preferred embodiments of the present invention.
Figure 18A:
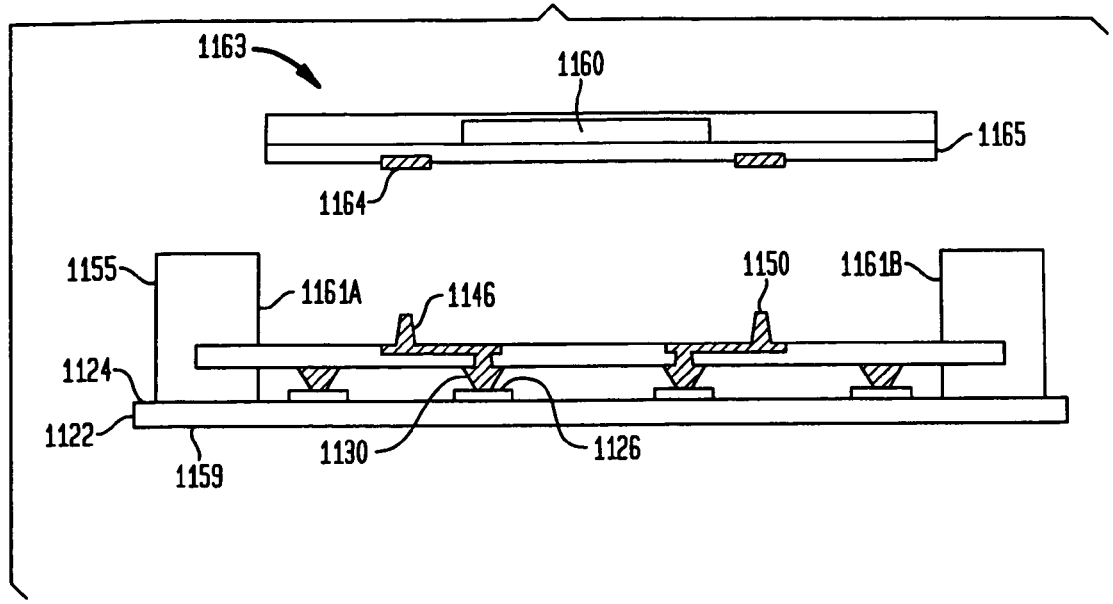
FIGS. 18A and 18B show a method for testing a microelectronic element, in accordance with certain preferred embodiments of the present invention.

The test socket assembly also preferably includes a microelectronic element such as a printed circuit board 1122 having a first surface 1124 with conductive pads 1126 accessible at the first surface 1124. Referring to FIGS. 16, 17 and 18A, the test socket is preferably assembled by abutting the bottom surface 1159 of the support frame 1155 against the top surface 1124 of the printed circuit board 1122. The frame is preferably secured to the printed circuit board 1122, with second conductive posts 1130 in substantial alignment with conductive pads 1126.

Figure 18B:
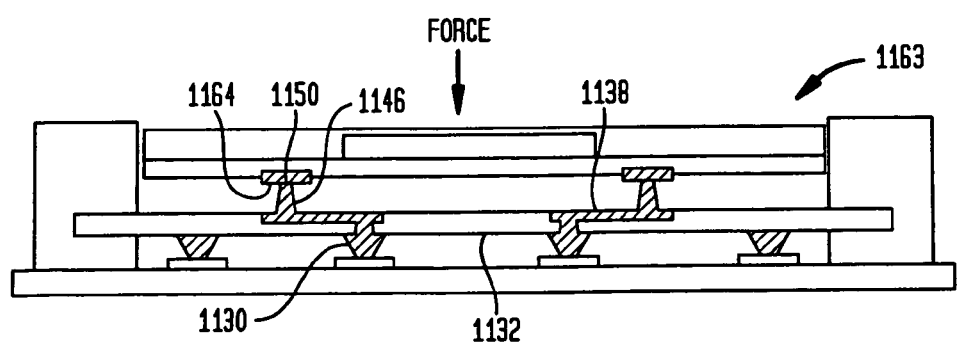

Referring to FIGS. 18A-18B, after the test socket has been assembled, a microelectronic element such as a semiconductor chip or semiconductor package may be electrically interconnected with the first conductive posts 1146 for testing the microelectronic element. In the particular embodiment shown in FIGS. 18A-18B, a microelectronic package 1163 includes a semiconductor chip 1160 mounted on a substrate 1165 with contacts 1164 being electrically interconnected with the chip 1160.

Referring to FIGS. 18A-18B, the inner walls 1161A, 1161B of the support frame 1155 may guide the microelectronic package 1163 toward the first conductive posts 1146, with contacts 1164 in substantial alignment with the first conductive posts 1146. Referring to FIG. 18B, the microelectronic package 1163 is moved downward in a direction indicated by the arrow F until the contacts 1164 of the package engage the tip ends 1150 of the first conductive posts 1146. As described above, the flexibility of the dielectric substrate 1134, and the offset between the first and second conductive posts, enables the first conductive posts 1146 to move independently of one another for accommodating non-planarity between the contacts 1164 on the microelectronic package 1163 and the tip ends 1150 of the first conductive posts 1146. In addition, the flexibility of the dielectric substrate 1132 enables the first and second conductive posts 1146, 1130 to move relative to one another while remaining electrically interconnected through the conductive traces 1138.

Figure 19A:
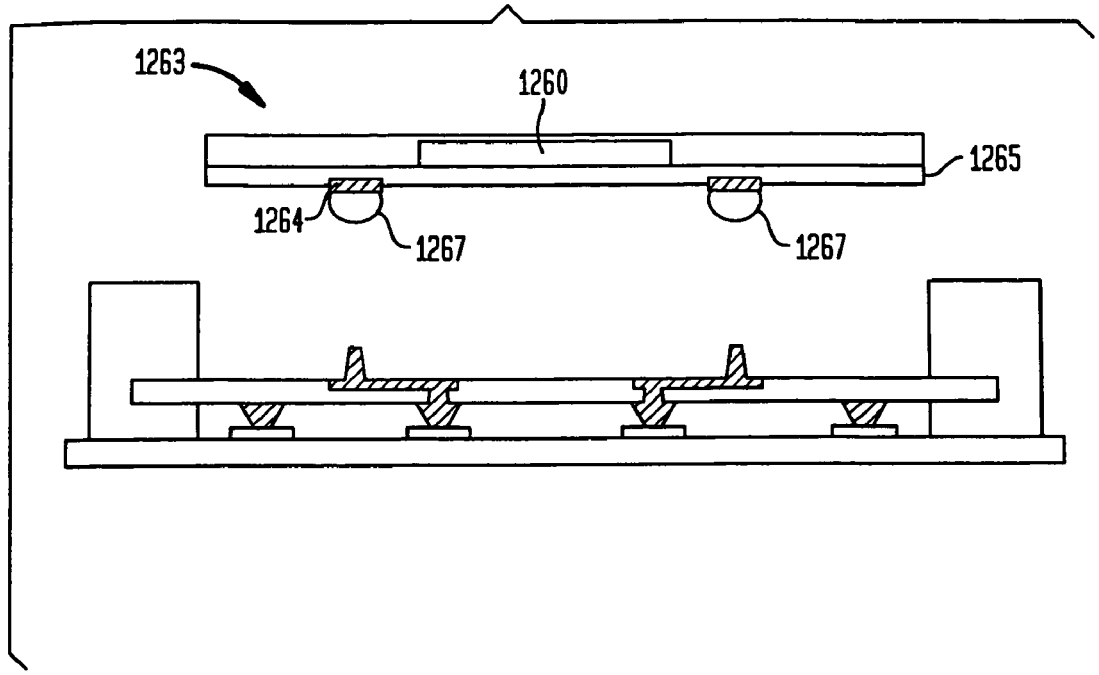
FIGS. 19A and 19B show a method of testing a microelectronic element, in accordance with another preferred embodiment of the present invention.
Figure 19B:
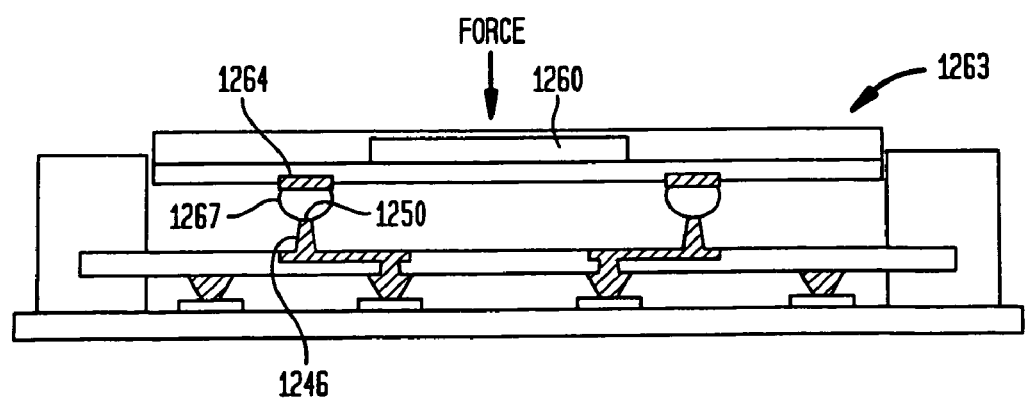

FIGS. 19A and 19B show a method of testing a ball grid array package 1263 using the test socket shown in FIGS. 18A and 18B. Referring to FIG. 19A, the microelectronic package 1263 includes a semiconductor chip 1260, a dielectric substrate 1265, contacts 1264 accessible at a bottom surface of the dielectric substrate 1265 and conductive balls or bumps 1267 provided over the contacts 1264.

Referring to FIG. 19B, the microelectronic package 1263 is preferably inserted into the opening of the test socket so that the conductive bumps 1267 engage the tips 1250 of the first conductive posts 1246. A downward force is applied on the microelectronic package 1263 to ensure a reliable connection between the conductive bumps 1267 and the first conductive posts 1246. After the downward force is applied to the package 1263, an electrical connection is preferably formed between the test socket and the contacts 1264 of the chip 1260 for testing the microelectronic package 1263.

Figure 20A:
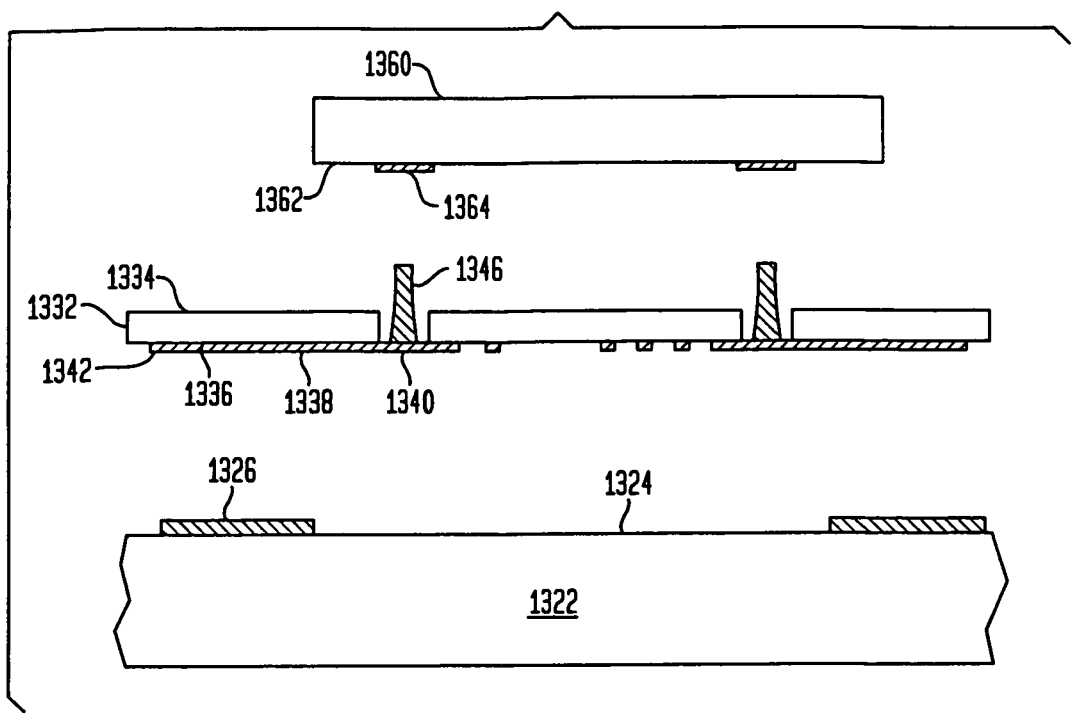
FIGS. 20A-20B show a method of making a microelectronic assembly, in accordance with still another preferred embodiment of the present invention.

FIG. 20A shows a microelectronic assembly in accordance with another preferred embodiment of the present invention. The microelectronic assembly includes a semiconductor chip 1360 having a first face 1362 with contacts 1364 accessible at the first face 1362. The assembly includes a flexible dielectric substrate 1332 having a first surface 1334 and a second surface 1336 remote therefrom. The assembly also includes conductive posts 1346 projecting above the first surface 1334 of the dielectric substrate 1332, and conductive traces 1338 extending over a surface of the substrate. In preferred embodiments, the traces can extend over either the first or the second surface of the substrate 1332, or between the first and second surfaces. At least some of the conductive traces 1338 have first ends 1340 electrically interconnected with the conductive posts 1346 and second ends 1342 that extend outwardly from the conductive posts 1346. The assembly also includes a substrate such as a printed circuit board 1322 having a first surface 1324 with conductive pads 1326 being accessible at the first surface 1324.

Figure 20B:
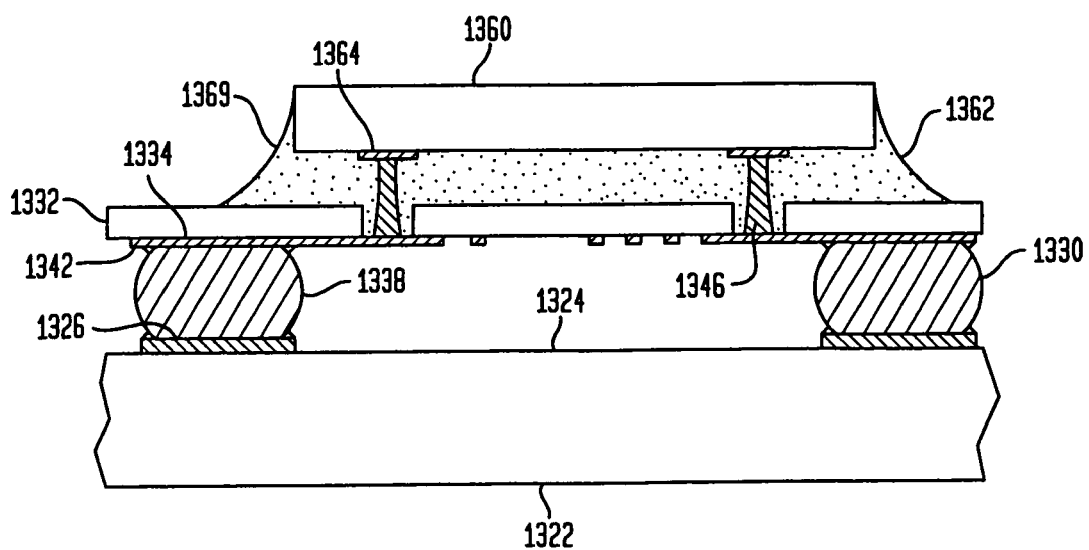

Referring to FIG. 20B, the semiconductor chip 1360 may be electrically interconnected with the flexible dielectric substrate 1332 by abutting tip ends of the conductive posts 1346 against the contacts 1364 of the chip 1360. An encapsulant material 1369 may be provided between the first face 1362 of chip 1360 and the first surface 1334 of flexible dielectric substrate 1332. The encapsulant 1369 may be rigid or compliant.

The chip 1360 and the flexible dielectric substrate 1332 assembled therewith are then juxtaposed with the top surface 1324 of printed circuit board 1322. The second ends 1342 of traces 1338 are preferably aligned with one or more of the conductive pads 1326 of printed circuit board 1322. The conductive traces 1338 and the conductive pads 1326 are preferably electrically interconnected with one another using conductive elements, such as solder, the conductive element shown in FIG. 2 or 3 above, or any other conductive element described herein. The conductive elements 1330 preferably span the gap between the conductive trace 1338 and the conductive pads 1326. After assembly, the second ends 1342 of the traces 1338 are able to move relative to the chip contacts 1364, because sections of the conductive traces 1338 lie outside the perimeter of the chip 1360 and the encapsulant 1369. As a result, the section of the trace 1338 overlying the conductive pads 1326 is able to move relative to the chip contacts 1364. As a result, the package shown in FIG. 20B is able to accommodate non-planarity between the conductive traces 1338 and the conductive pads 1326, and is able to maintain a reliable electrical interconnection during thermal cycling of the assembly and during shock to the assembly.

Figure 21:
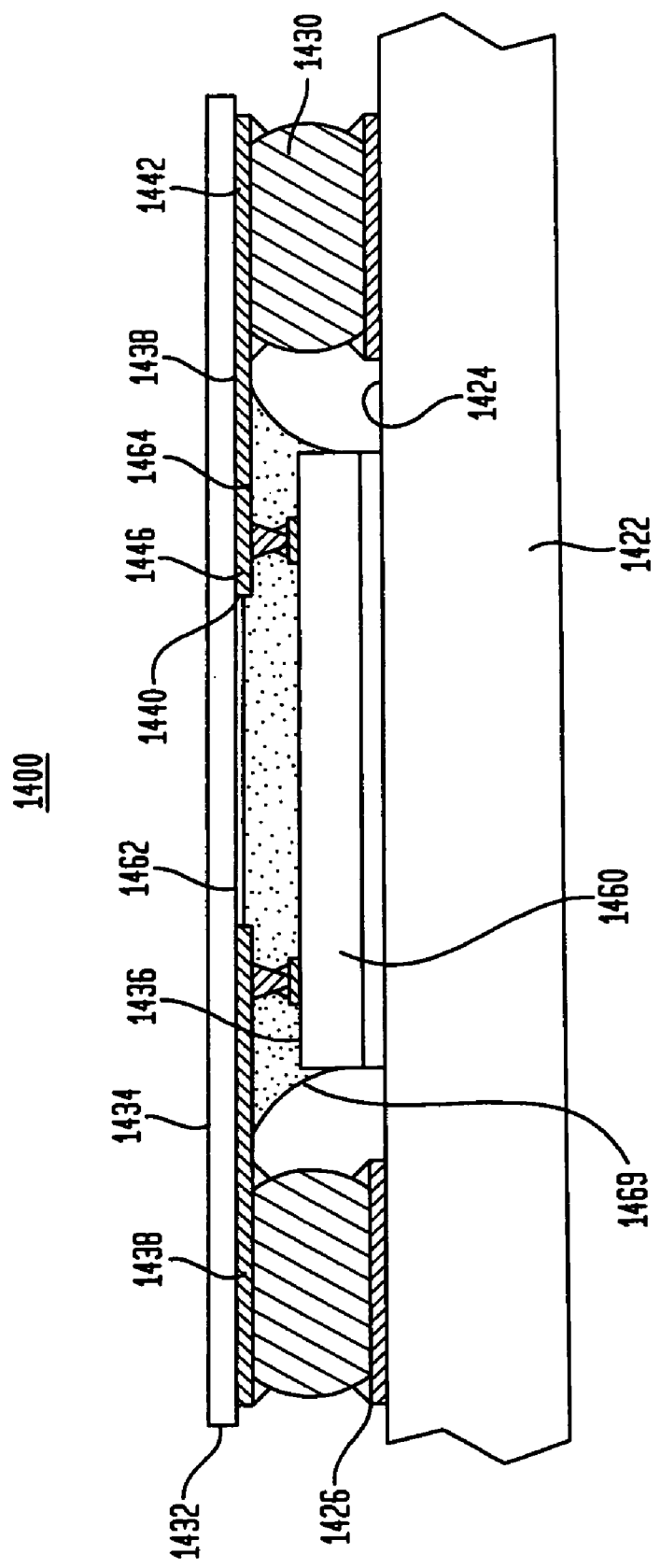
FIG. 21 shows a cross-sectional view of a microelectronic assembly, in accordance with yet another preferred embodiment of the present invention.

FIG. 21 shows a microelectronic assembly 1400 in accordance with another preferred embodiment of the present invention. The microelectronic assembly includes a flexible dielectric substrate 1432 having a top surface 1434 and a bottom surface 1436 remote therefrom. The package includes conductive traces 1438 that extend along the second face 1436 of the substrate 1432 and conductive posts 1446 that are electrically interconnected with first ends 1440 of the conductive traces 1438. The conductive traces 1438 preferably have second ends 1442 that extend outwardly and away from the conductive posts 1446.

The package 1400 also includes a microelectronic element such as a semiconductor chip 1460 having a first face 1462 with contacts 1464. The contacts 1464 are preferably electrically interconnected with the conductive posts 1446. The package preferably includes an encapsulant material 1469 that extends between the chip 1460 and the dielectric substrate 1432. The encapsulant may be compliant or rigid.

The assembly also includes a microelectronic element such as a printed circuit board 1322 having a top surface 1424 and conductive pads 1426 accessible at the top surface 1424. The flexible dielectric substrate 1432 is electrically interconnected with the printed circuit board 1422 by providing conductive elements 1430 such as solder balls that extend between the conductive traces 1438 and the conductive pads 1426. The electrical interconnections are preferably located outside the perimeter of the die 1460. As a result, the second ends 1442 of the traces 1438 may move relative to the contacts 1464 of the die 1460. Because the traces 1438 are able to move relative to the contacts 1464, the package 1400 is able to accommodate non-planarities and other non-uniformities between the package and the printed circuit board.

Figure 22:
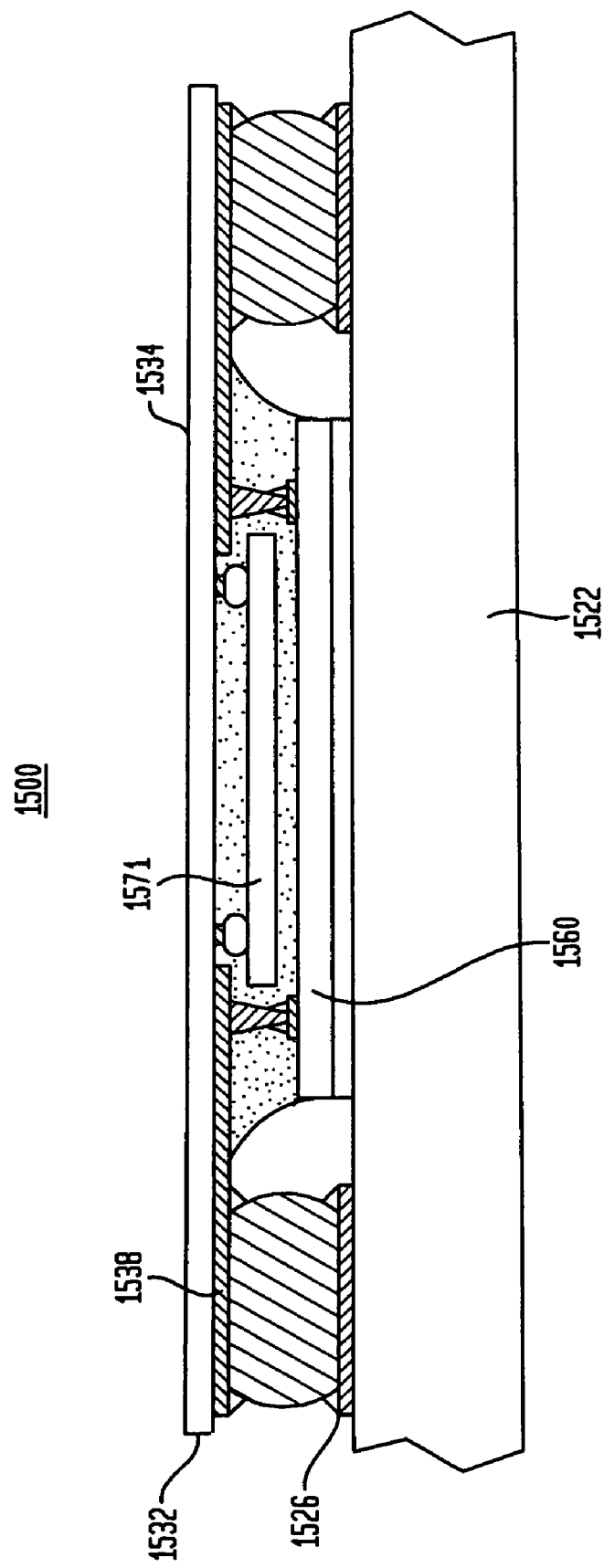
FIG. 22 shows a cross-sectional view of a microelectronic assembly, in accordance with certain preferred embodiments of the present invention.

FIG. 22 shows a microelectronic package 1500 in accordance with another preferred embodiment of the present invention. The microelectronic package 1500 is generally similar to the package shown in FIG. 21, with an additional semiconductor chip 1571 being electrically interconnected with flexible dielectric substrate 1532. As noted above, the conductive traces 1538 overlying the conductive pads 1526 of printed circuit board 1522 are able to move relative to the contacts on the chips 1571 and 1560 to accommodate for non-planarities and other non-uniformities between the package and the circuit board 1522. In other preferred embodiments, additional chips, die or microelectronic elements may be connected with the substrate 1532, either above or below the substrate. In one preferred embodiments, one or more chips may be attached to the substrate, over a top surface 1534 of the substrate 1532. These chips are preferably electrically interconnected with the conductive traces 1538 through methods well known to those skilled in the art.

Figure 23A:
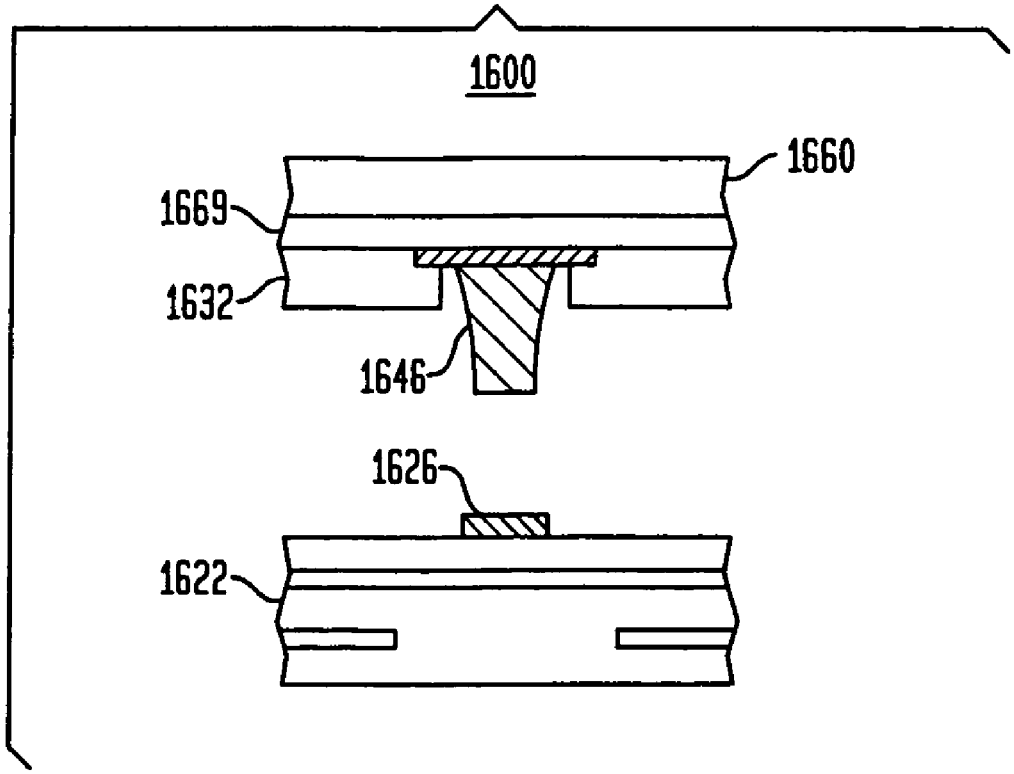
FIGS. 23A-23B show a prior art method of making a microelectronic assembly.
Figure 23B:
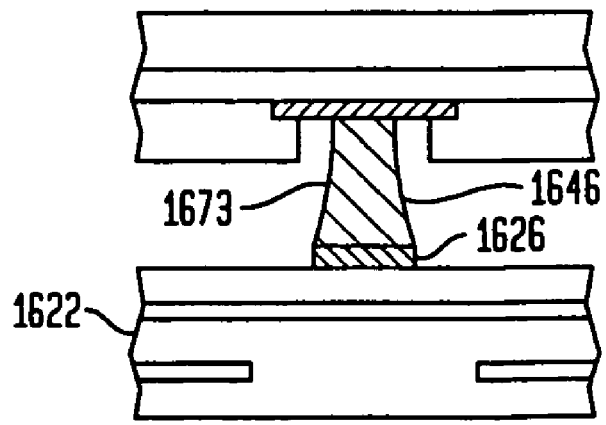

FIGS. 23A and 23B show a prior art method of connecting a microelectronic assembly with a substrate. Referring to FIG. 23A, the microelectronic assembly 1600 includes a semiconductor chip 1660, a substrate 1632 having conductive posts 1646 formed thereon and a compliant layer 1669 extending between the chip 1660 and the dielectric substrate 1632. In order to test the microelectronic assembly 1600, the conductive posts 1646 are aligned with conductive pads 1626 on a substrate 1622 such as a printed circuit board.

Referring to FIG. 23B, the microelectronic assembly 1600 may be electrically interconnected with the substrate 1622 using a fusible mass 1673 that connects conductive posts 1646 to conductive pads 1626, such as a mass of fusible solder. One problem with the assembly shown in FIG. 23B is that the overall height of the package is controlled in part by the height of the conductive posts 1646. Thus, there is a need to accommodate the height of the posts while providing a package having a lower overall height or lower overall silhouette.

Figure 24A:
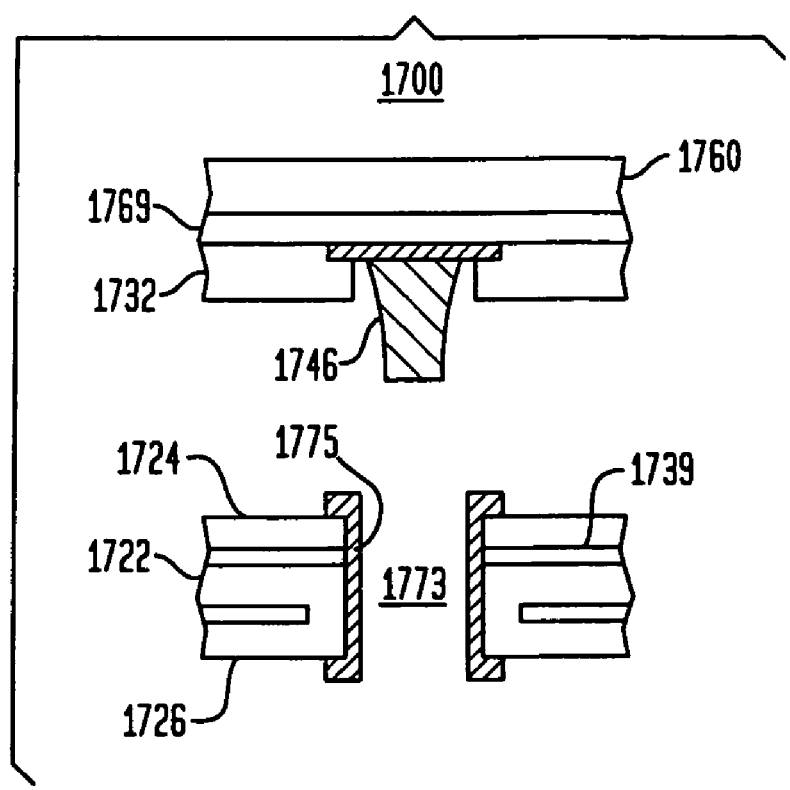
FIGS. 24A-24B show a method of making a microelectronic assembly, in accordance with another preferred embodiment of the present invention.
Figure 24B:
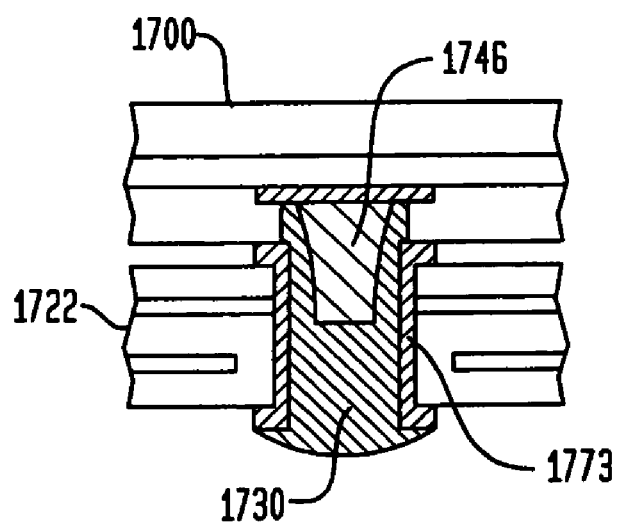

FIGS. 24A and 24B show a method of making a package having a lower overall height or silhouette, in accordance with further preferred embodiments of the present invention. The assembly includes a semiconductor chip 1760, a dielectric substrate 1732, and a compliant layer 1769 extending between the chip 1760 and the dielectric substrate 1732. The package also includes conductive posts 1746 projecting from the dielectric substrate 1732. In other preferred embodiments, the package may include a die with elongated conductive posts extending from contacts on the die.

Referring to FIG. 24B, the package may be electrically interconnected with a substrate 1722 such as a printed circuit board. The substrate 1722 includes a first surface 1724, a second surface 1726 remote therefrom, and elongated conductive elements 1739 extending therethrough. Substrate 1722 also has vias 1773 extending therethrough. The vias are preferably covered by a conductive material such as metal 1775. The metalized vias 1773 may extend between the first surface 1724 and the second surface 1726 of the substrate 1722.

Referring to FIG. 24B, the package 1700 may be electrically interconnected with the substrate 1722 by inserting the conductive post 1746 into the metalized via 1773. A mass of a conductive material such as solder 1730 may be used for forming a reliable electrical interconnection between the conductive posts 1746 and the metalized via 1773. Although the present invention is not limited by any particular theory of operation, it is believed that providing a metalized via 1773 in the substrate enables the conductive posts 1746 to be inserted at least partially therein for lowering the overall height of the assembly.

Figure 25A:
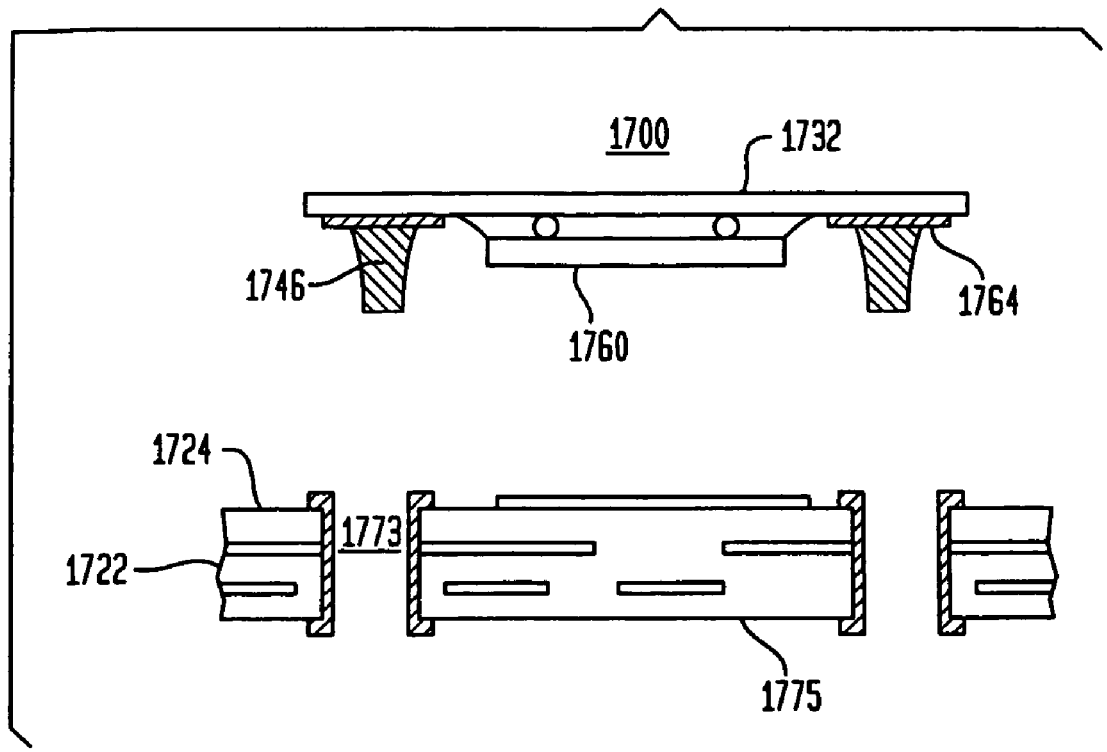
FIGS. 25A-25C show a method of making a microelectronic assembly, in accordance with another preferred embodiment of the present invention.
Figure 25B:
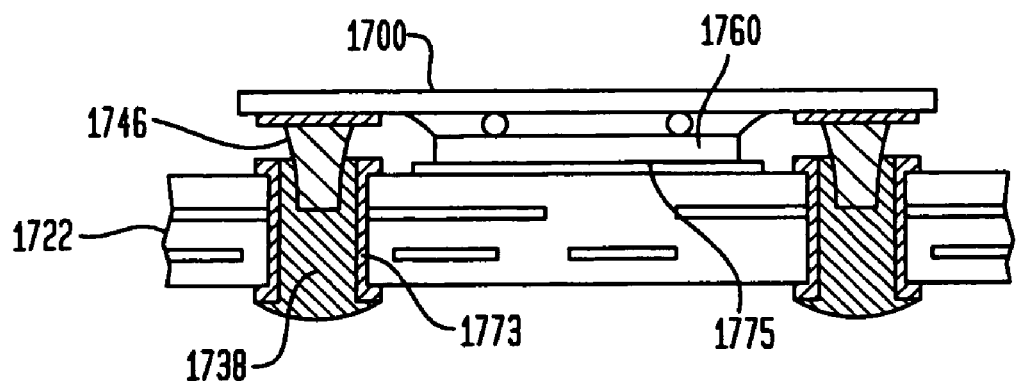
Figure 25C:
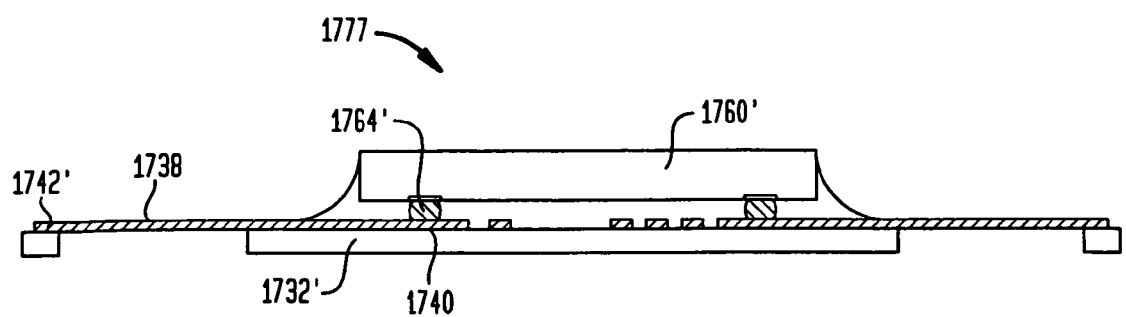

FIGS. 25A and 25B show another view of the method of assembling the device shown in FIGS. 24A-24B. Referring to FIG. 25A, microelectronic package 1700 includes conductive posts 1746 that are inserted in metalized vias 1773 of substrate 1722. The package 1700 has conductive elements, such as conductive posts 1746, that are able to move relative to the contacts 1764 of the chip 1760. Referring to FIG. 25B, a thermally conductive adhesive 1775 is provided over the first surface 1724 of substrate 1722. The thermally conductive adhesive 1775 is preferably at least partially aligned with the location of the chip 1760 for transferring thermal energy between the chip and the substrate.

Referring to FIG. 25B, the conductive posts 1746 of package 1700 are inserted into the metalized vias 1773 of the substrate 1722. The conductive mass 1730 preferably forms a reliable electrical interconnection between the conductive posts 1746 and the metalized vias 1773. As noted above, the thermally conductive adhesive 1775 allows heat transfer between chip 1760 and substrate 1722. Although the present invention is not limited by any particular theory of operation, it is believed that inserting the conductive posts 1746 at least partially into the metalized vias 1773 of the substrate 1722 reduces the overall height of the final assembly. As a result, space may be saved inside an electronic component, such as a cell phone.

Figure 26A:
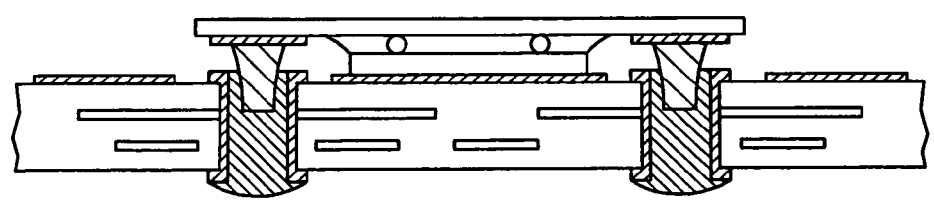
FIGS. 26A-26B show a method of making a microelectronic assembly, in accordance with yet further preferred embodiments of the present invention.
Figure 26B:
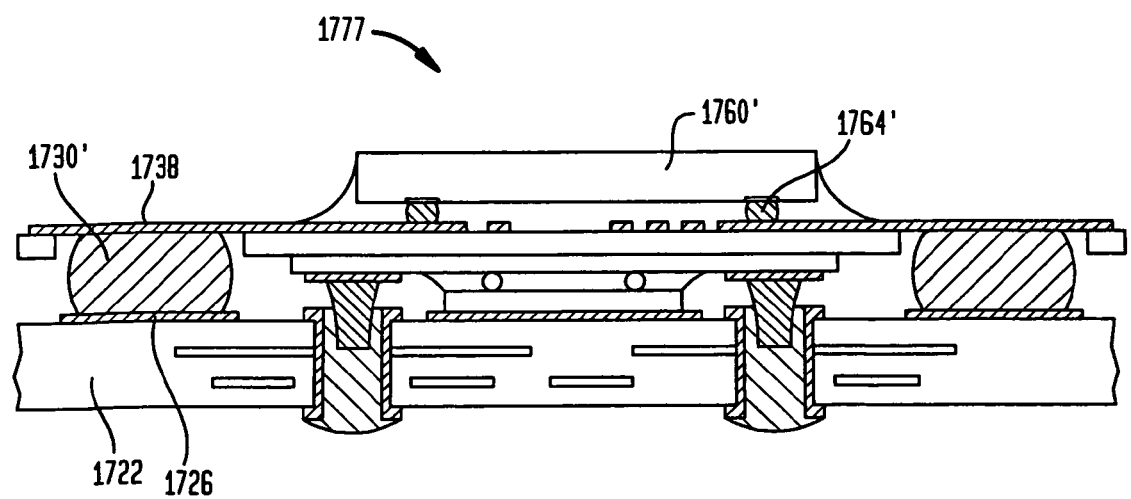

Referring to FIGS. 26A and 26B, a second microelectronic package 1777 may be assembled atop the microelectronic assembly shown in FIG. 25B. The second microelectronic package 1777 preferably includes a microelectronic element 1760' such as a semiconductor chip and a flexible dielectric substrate 1732 having conductive traces 1738 formed thereon. The conductive traces 1738 have first ends 1740 that are electrically interconnected with chip contacts 1764' by fusible masses and second ends 1742' that overlie openings in the flexible dielectric substrate 1732'.

Referring to FIG. 26B, the second microelectronic package 1777 may be electrically interconnected with the substrate 1722 using fusible masses 1730' such as solder for electrically interconnecting conductive traces 1738 with the conductive pads 1726 of substrate 1722. The sections of the traces 1738' in alignment with the conductive masses 1730' are able to move relative to the contacts 1764' on the chip 1760' for accommodating CTE mismatch and non-planarities.

Figure 27:
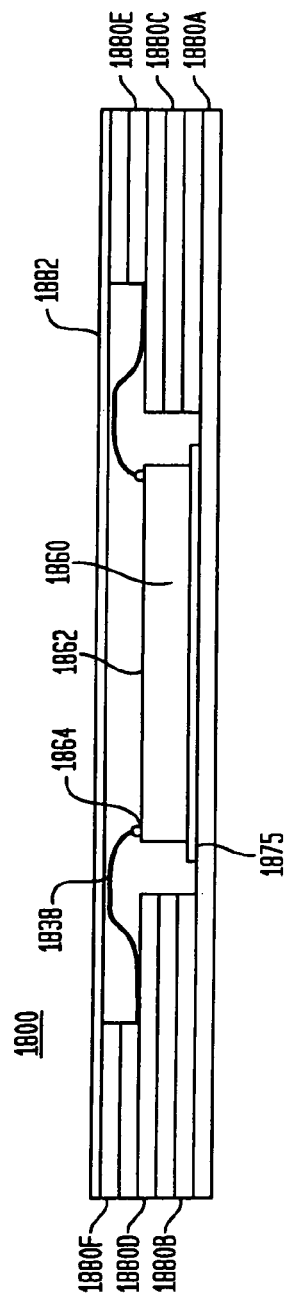
FIG. 27 shows a prior art microelectronic assembly.

FIG. 27 shows a prior art low temperature cofired ceramic (LTCC) package. The package 1800 includes six ceramic layers 1880A-1880F that are secured together, such as by being laminated together. The package 1800 includes a microelectronic element 1860 such as a semiconductor chip, having a first face 1862 including contacts 1864. Package 1800 also includes an adhesive material 1875 for connecting a back face of die 1860 to the bottom-most ceramic layer 1880A. The die 1860 is electrically interconnected with conductive features found on ceramic layer 1880D using wire bonds 1838. The wire bonds 1838 have a loop region that curves above the first face 1862 of chip 1860. The package 1800 includes a sealing cap 1882 procured over the top ceramic layer 1880F for enclosing the chip 1860 within the package. The wire bond loop increases the height of the package, thereby requiring additional ceramic layers for accommodating the height of the wire. Moreover, the wire bond arrangement isolates chip 1862 from the cap 1882.

Figure 28A:
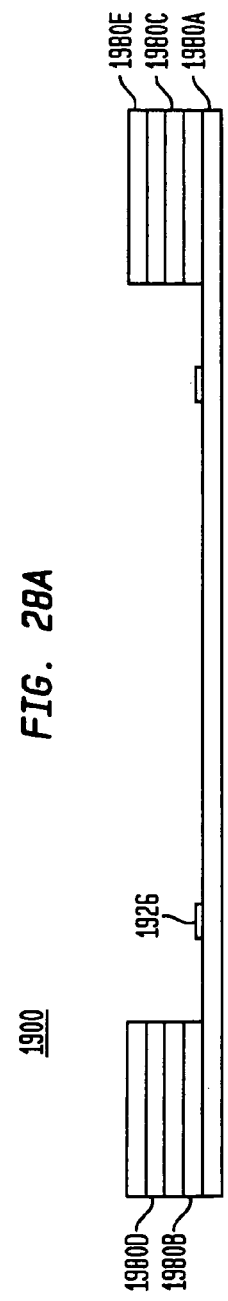

Referring to FIG. 28A, a low temperature cofired ceramic (LTCC) package 1900 in accordance with certain preferred embodiments of the present invention includes ceramic layers 1980A-1980E that are secured to one another. The lowermost ceramic layer 1980A includes conductive pads 1926 accessible at a top surface thereof.

Figure 28B:
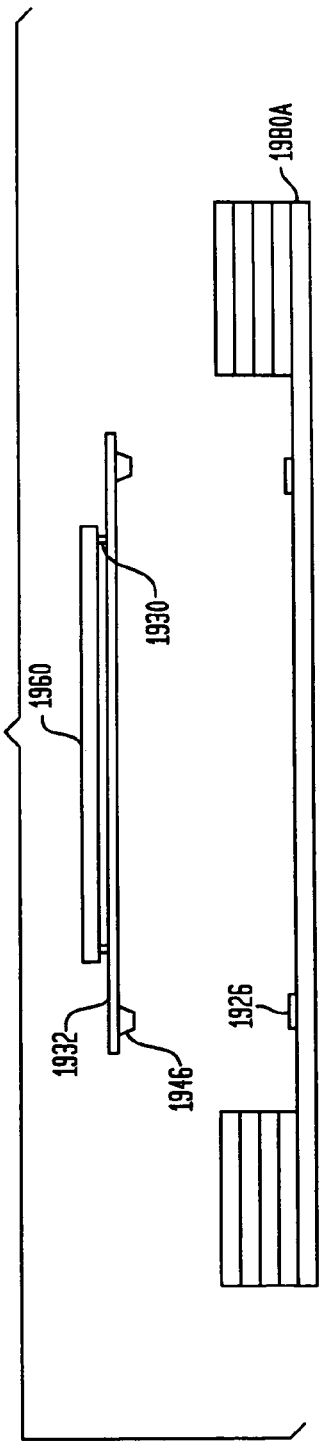

Referring to FIG. 28B, a microelectronic package incorporating one or more of the features described above is juxtaposed with the conductive pads 1926 of the lowermost ceramic layer 1980A. The package preferably includes a microelectronic element 1960 such as a chip, a flexible substrate 1932 that is electrically interconnected with the chip, and conductive posts 1946 that project from the flexible substrate. The package also desirably includes support elements 1930, such as the conductive support elements 30 shown in FIGS. 1C, 2 and 3 above. The support elements 1930 and the flexible substrate 1932 enable the conductive posts 1946 to move relative to one or more surfaces of the chip 1960. During assembly of the package to the LTCC, the conductive posts 1946 of the package are preferably aligned with the conductive pads 1926 on layer 1980A of the LTCC.

Referring to FIG. 28C, the tip ends of the conductive posts 1946 are preferably abutted against the conductive pads 1926 accessible at the lowermost ceramic layer 1980A. The flexibility of the flexible dielectric substrate 1932 enables the conductive posts 1946 to move accommodate for CTE mismatch, non-planarities and/or non-uniformities between the conductive posts 1946 and the conductive pads 1926. Moreover, the flip chip arrangement is a significant improvement over the wire-bonding configuration shown above in FIG. 27. As a result, the height of the package may be accommodated within a LTCC structure having only five ceramic layers 1980A-1980E, as opposed to the six layers required in the prior art LTCC package of FIG. 27. As a result, the final package will have a lower overall height or silhouette than the package manufactured using the techniques shown and described in FIG. 27. In addition, the space between the flexible substrate 1932 and the lower ceramic layer 1980A may enable electrically conductive elements such as traces to be provided on the portion of the layer 1980A under the flexible substrate 1932.

Referring to FIG. 28D, after the microelectronic package has been electrically interconnected with the conductive pads 1926 of the LTCC, a thermally conductive adhesive 1975 is preferably provided over the rear face of the die 1960. A thermally conductive sealing cap 1982 may be abutted against the thermally conductive adhesive 1975 and the top ceramic layer 1980E for sealing the package within the LTCC. During operation, heat may be removed from the package through the thermally conductive adhesive 1975 and the thermally conductive sealing cap 1982.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As disclosed in greater detail in the co-pending, commonly assigned U.S. Provisional Application No. 60/533,210 filed on Dec. 30, 2003, entitled "MICROELECTRONIC PACKAGES AND METHODS THEREFOR", the disclosure of which is hereby incorporated by reference herein, a support structure may include a plurality of spaced apart support elements and may also include a flexible sheet overlying the support elements. The support structure may have conductive posts offset in horizontal directions from the support elements. The offset between the conductive posts and the support elements allows the posts, and particularly the bases of the posts, to move independently of one another relative to a microelectronic element. The motion of the posts may include a tilting motion, which causes the tip of each post to wipe across an opposing contact pad as the tip is engaged with the contact pad. The wiping action has been found to promote reliable electrical contact.

As disclosed in greater detail in the co-pending, commonly assigned U.S. Provisional Application No. 60/533,393 filed Dec. 30, 2003, entitled "MICRO PIN GRID ARRAY WITH WIPING ACTION," the disclosure of which is hereby incorporated by reference herein, the conductive posts may be provided with features that promote wiping action and otherwise facilitate engagement of the posts and contacts.

As disclosed in greater detail in the co-pending, commonly assigned U.S. Provisional Application No. 60/533,437 filed Dec. 30, 2003, entitled "MICRO PIN GRID WITH PIN MOTION ISOLATION," the disclosure of which is hereby incorporated by reference herein, the flexible substrate may be provided with features to enhance the ability of the posts to move independently of one another and which enhance the tilting and wiping action. In one particular preferred embodiment, a microelectronic package includes a microelectronic element having faces and contacts, a flexible substrate overlying and spaced from a first face of the microelectronic element, and a plurality of conductive terminals exposed at a surface of the flexible substrate. The conductive terminals are electrically interconnected with the microelectronic element and the flexible substrate includes a gap extending at least partially around at least one of the conductive terminals. In certain embodiments, the package includes a support layer, such as a compliant layer, disposed between the first face of the microelectronic element and the flexible substrate. In other embodiments, the support layer includes at least one opening that is at least partially aligned with one of the conductive terminals.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An assembly for testing microelectronic devices, comprising:
    a microelectronic element having faces and contacts;
    a flexible substrate spaced from and overlying a first face of said microelectronic element;
    a plurality of substantially rigid conductive posts extending from said flexible substrate and projecting away from the first face of said microelectronic element, at least some of said conductive posts being electrically interconnected with said microelectronic element; and
    a plurality of support elements disposed between the first face of said microelectronic element and said flexible substrate and supporting said flexible substrate over said microelectronic element, at least some of said substantially rigid conductive posts being offset from said support elements,
    wherein said plurality of support elements are disposed in an array so that said support elements define a plurality of uniformly distributed, same shaped zones of said flexible substrate, each one of said plurality of zones is bounded by an associated portion of said plurality of support elements which define corners of that zone, and different ones of said conductive posts are disposed in different ones of said zones such that, in each respective zone, only one of said conductive posts is disposed in that zone and is bounded by three or more of said support elements.

2. The assembly as claimed in claim 1, wherein said first face is a front face of said microelectronic element and said contacts are accessible at said front face.

3. The assembly as claimed in claim 2, wherein at least some of said support elements are electrically conductive, said conductive support elements electrically interconnecting at least some of the contacts of said microelectronic element with at least some of said conductive posts.

4. The assembly as claimed in claim 3, further comprising a support frame engaging said flexible substrate.

5. The assembly as claimed in claim 4, wherein said flexible substrate has an outer periphery and said support frame is attached to the outer periphery of said flexible substrate.

6. The assembly as claimed in claim 3, wherein said support elements comprise a plurality of second conductive posts extending from said flexible substrate and projecting toward the first face of said microelectronic element, at least some of said second conductive posts being electrically interconnected with said first conductive posts.

7. The assembly as claimed in claim 6, wherein at least one of said first conductive posts is electrically interconnected to at least one of said contacts through one of said second conductive posts disposed immediately adjacent to the at least one of said first conductive posts.

8. The assembly as claimed in claim 1, further comprising conductive traces provided on said flexible substrate, wherein said conductive traces electrically interconnect at least some of said conductive posts with at least some of said contacts on said microelectronic element.

9. The assembly as claimed in claim 1, wherein said flexible substrate has a bottom surface facing the first face of said microelectronic element and said conductive traces extend along the bottom surface of said flexible substrate.

10. The assembly as claimed in claim 1, wherein said flexible substrate has a top surface facing away from the first face of said microelectronic element and said conductive traces extend along the top surface of said flexible substrate.

11. The assembly as claimed in claim 1, wherein said contacts are spaced from one another in a grid array over the first face of said microelectronic element.

12. The assembly as claimed in claim 1, wherein at least some of said contacts are aligned in a row.

13. The assembly as claimed in claim 1, wherein said contacts are randomly spaced from one another over the first face of said microelectronic element.

14. The assembly as claimed in claim 1, wherein some of said contacts are uniformly spaced from one another and some of said contacts are randomly spaced from one another over the first face of said microelectronic element.

15. The assembly as claimed in claim 1, wherein at least one of said conductive support elements comprises a mass of a fusible material.

16. The assembly as claimed in claim 1, wherein at least one of said conductive support elements comprises a dielectric core and an electrically conductive outer coating over the dielectric core.

17. The assembly as claimed in claim 1, wherein said flexible substrate comprises a dielectric sheet.

18. The assembly as claimed in claim 1, further comprising a compliant material disposed between said flexible substrate and said microelectronic element.

19. The assembly as claimed in claim 1, wherein at least one of said conductive posts is elongated.

20. The assembly as claimed in claim 1, wherein at least some of said conductive posts are generally frustoconical.

21. The assembly as claimed in claim 1, wherein said plurality of zones are each triangular shaped so that each one of said conductive posts is bounded by three of said support elements.

22. The assembly as claimed in claim 1, wherein said plurality of zones are each rectangular shaped so that each one of said conductive posts is bounded by four of said support elements.

23. The assembly as claimed in claim 1, wherein said plurality of zones are each hexagonal shaped so that each one of said conductive posts is bounded by six of said support elements.

24. A microelectronic assembly comprising:
a microelectronic element having faces and contacts;
a flexible substrate spaced from and overlying a first face of said microelectronic element;
a plurality of substantially rigid first conductive posts extending from said flexible substrate and projecting away from the first face of said microelectronic element, at least some of said substantially rigid first conductive posts being electrically interconnected with said microelectronic element; and
a plurality of second conductive posts extending from said flexible substrate and projecting toward the first face of said microelectronic element, said second conductive posts supporting said flexible substrate over said microelectronic element, at least some of said first conductive posts being offset from said second conductive posts,
wherein said plurality of second conductive posts are disposed in an array so that said second conductive posts define a plurality of uniformly distributed, same shaped zones of said flexible substrate, each one of said plurality of zones is bounded by an associated portion of said plurality of second conductive posts which define corners of that zone, and different ones of said first conductive posts are disposed in different ones of said zones such that, in each respective zone, only one of said first conductive posts is disposed in that zone and is bounded by three or more of said second conductive posts.

25. The assembly as claimed in claim 24, further comprising a low temperature co-fired ceramic (LTCC) structure having a bottom layer with contacts, wherein said first conductive posts are electrically interconnected with the contacts of the bottom layer of said LTCC structure.

26. The assembly as claimed in claim 25, further comprising a sealing cap in contact with a top layer of said LTCC structure and in thermal communication with a second face of said microelectronic element.

27. The assembly as claimed in claim 24, wherein said microelectronic element is a semiconductor chip.

28. The assembly as claimed in claim 24, wherein said microelectronic element is a printed circuit board.

29. The assembly as claimed in claim 24, wherein said first face of said microelectronic element is a front face of said microelectronic element and said contacts are accessible at said front face.

30. The assembly as claimed in claim 24, wherein at least some of said second conductive posts are electrically conductive, said second conductive posts electrically interconnecting at least some of the contacts of said microelectronic element with at least some of said first conductive posts.

31. The assembly as claimed in claim 24, wherein at least some of said first conductive posts are connected to at least some of said contacts by said second conductive posts immediately adjacent to the at least some of said first conductive posts.

32. The assembly as claimed in claim 24, further comprising conductive traces provided on said flexible substrate, wherein said conductive traces electrically interconnect at least some of said first conductive posts with at least some of said contacts on said microelectronic element.

33. The assembly as claimed in claim 32, wherein at least one of said conductive traces extends between two of said first conductive posts that are adjacent to one another.

34. The assembly as claimed in claim 32, wherein said flexible substrate has a bottom surface facing the first face of said microelectronic element and said conductive traces extend along the bottom surface of said flexible substrate.

35. The assembly as claimed in claim 32, wherein said flexible substrate has a top surface facing away from the first face of said microelectronic element and said conductive traces extend along the top surface of said flexible substrate.

36. The assembly as claimed in claim 24, wherein at least some of said contacts are spaced from one another in a grid array.

37. The assembly as claimed in claim 24, wherein at least some of said contacts are aligned in a row.

38. The assembly as claimed in claim 24, wherein said contacts are non-uniformly spaced from one another.

39. The assembly as claimed in claim 24, wherein some of said contacts are uniformly spaced from one another and others of said contacts are non-uniformly spaced from one another.

40. The assembly as claimed in claim 24, wherein said first conductive posts have a base facing toward said flexible substrate.

41. The assembly as claimed in claim 24, wherein said plurality of second conductive posts are etched conductive posts.

42. The assembly as claimed in claim 22, wherein at least some of said first conductive posts are generally frustoconical.

43. The assembly as claimed in claim 24, wherein said plurality of zones are each triangular shaped so that each one of said first conductive posts is bounded by three of said second conductive posts.

44. The assembly as claimed in claim 24, wherein said plurality of zones are each rectangular shaped so that each one of said first conductive posts is bounded by four of said second conductive posts.

45. The assembly as claimed in claim 24, wherein said plurality of zones are each hexagonal shaped so that each one of said first conductive posts is bounded by six of said second conductive posts.

* * * * *

UNITED STATES PATENT AND TRADEMARK OFFICE
CERTIFICATE OF CORRECTION

| | | |
|---|---|---|
| PATENT NO. | : 7,939,934 B2 | Page 1 of 1 |
| APPLICATION NO. | : 11/315466 | |
| DATED | : May 10, 2011 | |
| INVENTOR(S) | : Belgacem Haba and David Gibson | |

It is certified that error appears in the above-identified patent and that said Letters Patent is hereby corrected as shown below:

Column 28, line 49, "22" should read --24--.

Signed and Sealed this
Twenty-third Day of October, 2012

David J. Kappos
*Director of the United States Patent and Trademark Office*